United States Patent
Yu et al.

(10) Patent No.: US 11,069,417 B2
(45) Date of Patent: Jul. 20, 2021

(54) MEMORY SYSTEM AND METHOD OF OPERATING THE SAME

(71) Applicant: Samsung Electronics Co., Ltd., Suwon-si (KR)

(72) Inventors: Jaeduk Yu, Seoul (KR); Bongsoon Lim, Seoul (KR); Yonghyuk Choi, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/940,935

(22) Filed: Jul. 28, 2020

(65) Prior Publication Data

US 2021/0065828 A1 Mar. 4, 2021

Related U.S. Application Data

(63) Continuation-in-part of application No. 16/891,457, filed on Jun. 3, 2020.

(30) Foreign Application Priority Data

Aug. 27, 2019 (KR) ........................ 10-2019-0105004

(51) Int. Cl.
*G11C 16/34* (2006.01)
*G11C 16/16* (2006.01)
*G11C 16/32* (2006.01)
*G11C 16/26* (2006.01)
*G11C 16/30* (2006.01)

(52) U.S. Cl.
CPC .......... *G11C 16/3472* (2013.01); *G11C 16/16* (2013.01); *G11C 16/26* (2013.01); *G11C 16/30* (2013.01); *G11C 16/32* (2013.01)

(58) Field of Classification Search
CPC ..... G11C 16/3472; G11C 16/16; G11C 16/32; G11C 16/26; G11C 16/30
USPC ....................................... 365/185.22, 185.25
See application file for complete search history.

(56) References Cited

U.S. PATENT DOCUMENTS

| | | | | |
|---|---|---|---|---|
| 5,367,484 A | * | 11/1994 | Alexander | G11C 16/10 365/185.09 |
| 6,326,943 B1 | * | 12/2001 | Inoue | G09G 3/3629 345/101 |
| 7,679,133 B2 | | 3/2010 | Son et al. | |
| 7,948,798 B1 | | 5/2011 | Sheredy et al. | |

(Continued)

*Primary Examiner* — Michael T Tran
(74) *Attorney, Agent, or Firm* — Harness, Dickey & Pierce, P.L.C.

(57) ABSTRACT

A memory device, a memory system, and/or a method of operating a memory system includes measuring, using processing circuitry, an erase program interval (EPI) of a memory group included in a non-volatile memory (NVM), the EPI being a time period from an erase time point to a program time point of the memory group, determining, using the processing circuitry, a plurality of program modes based on a number of data bits stored in each memory cell of the memory group, selecting, using the processing circuitry, a program mode for the memory group from the plurality of program modes, based on the measured EPI of the memory group, and performing, using the processing circuitry, a program operation on the memory group corresponding to the selected program mode.

20 Claims, 31 Drawing Sheets

(56) References Cited

U.S. PATENT DOCUMENTS

| | | | |
|---|---|---|---|
| 8,244,960 B2* | 8/2012 | Paley | G06F 12/0246 |
| | | | 711/103 |
| 8,472,245 B2* | 6/2013 | Kim | G11C 16/0483 |
| | | | 365/185.03 |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,891,303 B1 | 11/2014 | Higgins et al. | |
| 9,646,705 B2* | 5/2017 | Moon | G11C 16/349 |
| 9,704,579 B1* | 7/2017 | Bayle | G11C 16/0483 |
| 9,875,793 B2 | 1/2018 | Kim et al. | |
| 10,042,754 B2* | 8/2018 | Moon | G06F 12/0246 |
| 10,209,902 B1 | 2/2019 | Sheredy et al. | |
| 2004/0189439 A1* | 9/2004 | Cansino | H04L 67/025 |
| | | | 340/5.2 |
| 2011/0233648 A1 | 9/2011 | Seol et al. | |
| 2013/0159785 A1* | 6/2013 | Hashimoto | G11C 29/52 |
| | | | 714/47.2 |
| 2013/0173844 A1 | 7/2013 | Chen et al. | |
| 2014/0369124 A1* | 12/2014 | Moon | G11C 16/16 |
| | | | 365/185.11 |
| 2015/0205539 A1* | 7/2015 | Moon | G06F 3/0652 |
| | | | 711/103 |
| 2016/0179430 A1 | 6/2016 | Kong et al. | |
| 2017/0109917 A1* | 4/2017 | Wang | G06F 3/041 |
| 2017/0235489 A1 | 8/2017 | Lin et al. | |
| 2018/0293001 A1 | 10/2018 | Muchherla et al. | |
| 2019/0095116 A1* | 3/2019 | Igahara | G06F 3/0619 |
| 2019/0156903 A1* | 5/2019 | Yu | G11C 16/3431 |
| 2019/0171391 A1* | 6/2019 | Dubeyko | G06F 3/0619 |
| 2020/0130085 A1* | 4/2020 | Miyazaki | B23K 3/08 |
| 2021/0012851 A1* | 1/2021 | Huang | G11C 29/886 |

* cited by examiner

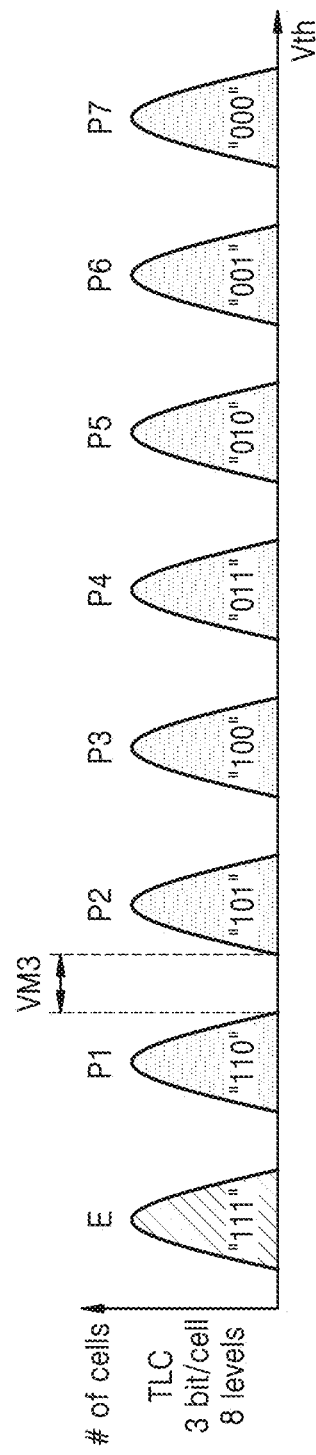

FIG. 16A

PGM MODE TABLE — PMT1

| LPN | PGM MODE |
|---|---|
| LPN1 | QLC |
| LPN2 | MLC |
| ... | ... |

FIG. 16B

PGM MODE TABLE — PMT1'

| PPN | PGM MODE |
|---|---|
| PPN1 | QLC |
| PPN2 | MLC |
| ... | ... |

EPI TABLE

| STACK ID | EPI |
|---|---|
| STK1 | t1' |
| STK2 | t2' |
| ... | ... |

PGM MODE TABLE

| STACK ID | PGM MODE |
|---|---|
| STK1 | QLC |
| STK2 | MLC |
| ... | ... |

FIG. 22A

EPI TABLE — ET3

| SUB BLOCK ID | EPI |
|---|---|
| SBLK1 | t1" |
| SBLK2 | t2" |
| ... | ... |

FIG. 22B

PGM MODE TABLE — PMT3

| SUB BLOCK ID | PGM MODE |
|---|---|
| SBLK1 | QLC |
| SBLK2 | MLC |
| ... | ... |

MEMORY SYSTEM AND METHOD OF OPERATING THE SAME

CROSS-REFERENCE TO RELATED APPLICATION

This application is a continuation-in-part of U.S. application Ser. No. 16/891,457, filed on Jun. 3, 2020, which claims the benefit of priority to Korean Patent Application No. 10-2019-0105004, filed on Aug. 27, 2019, in the Korean Intellectual Property Office, the disclosure of each of which is incorporated herein in their entireties by reference.

BACKGROUND

Various example embodiments of the inventive concepts relate to a memory system, a memory device, and more particularly, to a memory system having improved threshold voltage distribution characteristics, a memory device having improved threshold voltage distribution characteristics, and/or a method of operating the same.

A memory system may include a memory controller and a memory device. The memory device may include a non-volatile memory device. A flash memory device, which is an example of a non-volatile memory (NVM) device, may be used in portable phones, digital cameras, personal digital assistants (PDAs), transportable computer devices, fixed computer devices, and other devices. The flash memory device may include a plurality of blocks, each of which may include a plurality of pages. In the flash memory device, a period until a program operation is performed on a block after an erase operation is performed on the block may be defined as an erase program interval (EPI). Due to the characteristics of a flash memory device, when an EPI is long (e.g., has a long duration) during a data write operation, threshold voltage distribution characteristics of the flash memory device may be degraded, and thus, the reliability of data stored on the flash memory device may be degraded.

SUMMARY

According to an aspect of at least one example embodiment of the inventive concepts, there is provided a method of operating a memory system including a non-volatile memory. The method includes measuring, using processing circuitry, an erase program interval (EPI) of a memory group, the EPI being a time period from an erase time point to a program time point of the memory group, the memory group included in the non-volatile memory, determining, using the processing circuitry, a plurality of program modes based on a number of data bits stored in each memory cell of the memory group, selecting, using the processing circuitry, a program mode for the memory group from the plurality of program modes, based on the measured EPI of the memory group, and performing, using the processing circuitry, a program operation on the memory group corresponding to the selected program mode, the performing the program operation on the memory group including adjusting at least one voltage level of the program operation based on the selected program mode.

According to another aspect of at least one example embodiment of the inventive concepts, there is provided a method of operating a memory system including a non-volatile memory. The method includes measuring, using processing circuitry, an erase program interval (EPI) of a memory block of the non-volatile memory in response to a write request received from a host, the EPI being a time period from an erase time point to a program time point of the memory block, and performing, using the processing circuitry, a program operation on the memory block in a first program mode or a second program mode based on a duration of the EPI, the first program mode including writing N-bit data to each memory cell of the memory block, and the second program mode including writing M-bit data to each memory cell of the memory block, the performing the program operation on the memory block including adjusting at least one voltage level of the program operation based on the first program mode or the second program mode. Here, N and M are positive integers, and M is less than N.

According to another aspect of at least one example embodiment of the inventive concepts, there is provided a memory system including a non-volatile memory including a plurality of memory groups, and a memory controller configured to measure an erase program interval (EPI) of a first memory group from among the plurality of memory groups, the EPI being a time period from an erase time point to a program time point of the memory group, determine a plurality of program modes based on a number of data bits stored in each memory cell of the memory group, select a program mode for the first memory group from the plurality of program modes based on the measured EPI, and control a program operation on the first memory group based on the selected program mode of the first memory group, the controlling the program operation including adjusting at least one voltage level associated with the program operation based on the selected program mode.

BRIEF DESCRIPTION OF THE DRAWINGS

Various example embodiments of the inventive concepts will be more clearly understood from the following detailed description taken in conjunction with the accompanying drawings in which:

FIGS. 4A to 4D are example graphs showing distributions of threshold voltages of memory cells that are programmed to a single-level cell (SLC) mode, a multi-level cell (MLC) mode, a triple-level cell (TLC) mode, and a quadruple-level cell (QLC) mode, respectively, according to some example embodiment;

FIGS. 16A and 16B show program mode tables according to some example embodiments;

FIGS. 22A and 22B show an EPI table and a program mode table, respectively, according to some example embodiments;

DETAILED DESCRIPTION

Hereinafter, various example embodiments will be described in detail with reference to the attached drawings.

Figure 1:
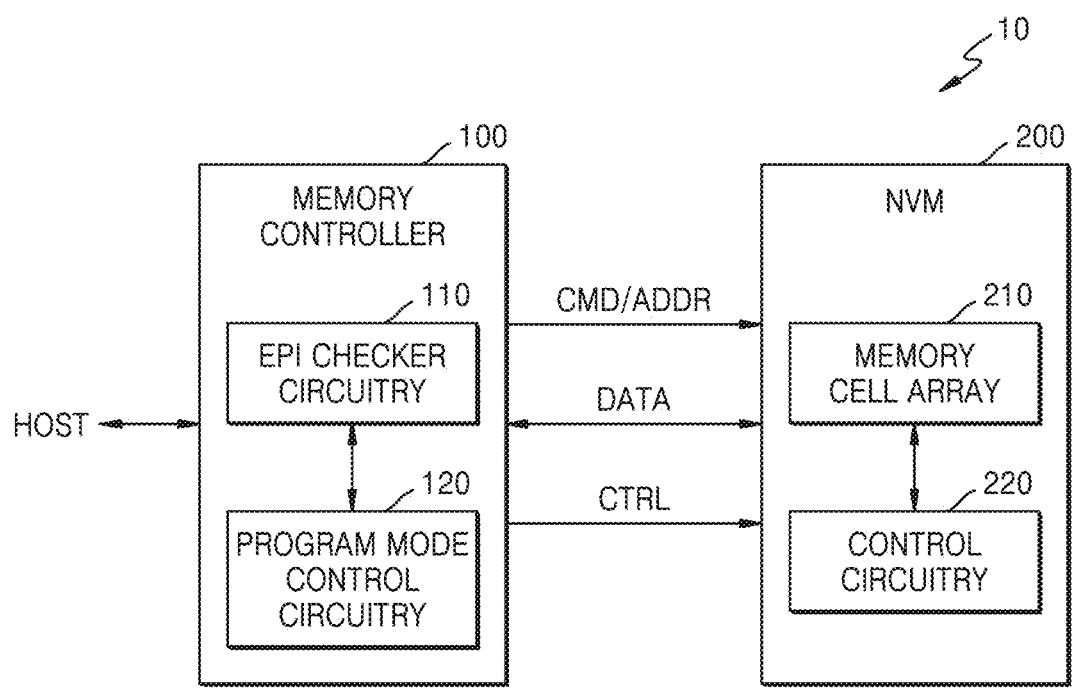
FIG. 1 is a block diagram of a memory system according to at least one example embodiment.

FIG. 1 is a block diagram of a memory system 10 according to at least one example embodiment.

Referring to FIG. 1, the memory system 10 may include a memory controller 100 and/or a non-volatile memory (NVM) 200, etc., but the example embodiments are not limited thereto and a greater or lesser number of constituent elements may be included in the memory system 10. In at least one example embodiment, the NVM 200 may be implemented as a memory chip, and the memory system 10 may include a plurality of memory chips, etc. In at least one example embodiment, the memory controller 100 may be respectively connected to the plurality of chips through a plurality of channels, or a single channel. For example, the memory system 10 may be implemented as a storage device, such as a solid-state drive (SSD), etc.

The memory controller 100 may control the NVM 200 to program data to the NVM 200, read data stored in the NVM 200 in response to a write/read request from a host HOST, or erase data stored in the NVM 200 in response to an erase request form the host HOST, etc. For example, the memory controller 100 may provide a command CMD and an address ADDR to the NVM 200 and control program, read, and erase operations on the NVM 200. Also, data DATA to be programmed and read data DATA may be transmitted and received between the memory controller 100 and the NVM 200. In at least one example embodiment, the command CMD and the address ADDR may be transmitted from the memory controller 100 to the NVM 200 using the same input/output (I/O) channel as that of data DATA. In at least one example embodiment, the command CMD and the address ADDR may be transmitted from the memory controller 100 to the NVM 200 using a first I/O channel, while data DATA may be transmitted from the memory controller 100 to the NVM 200 using a second I/O channel, however the example embodiments are not limited thereto. Also, the memory controller 100 may further provide a control signal CTRL to the NVM 200.

The NVM 200 may include a memory cell array 210 and/or a control circuitry 220 (e.g., a control logic, a controller, etc.), etc., but is not limited thereto. The memory cell array 210 may include a plurality of memory cells. For example, the plurality of memory cells may be flash memory cells. Hereinafter, example embodiments will be described in detail based on the assumption that the plurality of memory cells are NAND flash memory cells. However, the example embodiments of the inventive concepts are not limited thereto, and the plurality of memory cells may be resistive memory cells, such as resistive RAM (ReRAM) cells, phase-change RAM (PRAM) cells, and/or magnetic RAM (MRAM) cells, etc. The memory cell array 210 may include a plurality of blocks, each of which may include a plurality of pages. Each of the pages may include a plurality of memory cells. In the memory cell array 210, a data erase operation may be performed in block units, and data write/read operations may be performed in page units, but they are not limited thereto.

The control circuitry 220 may control the overall operation of the NVM 200 in relation to a memory operation. The control circuitry 220 may output various control signals for programming data to the memory cell array 210, reading data from the memory cell array 210, and/or erasing data stored in the memory cell array 210 based on the command CMD and the address ADD, which are received from the memory controller 100. According to at least one example embodiment, the control circuitry 220 may include hardware including logic circuits; a hardware/software combination such as a processor executing software; or a combination thereof. For example, the control circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In a flash memory device, a period from an erase time point of a block to a program time point of the block may be defined as an erase program interval (EPI) of the block. Due to the characteristics of a flash memory device, especially a vertical NAND (VNAND) flash memory including a three-dimensional (3D) block, but not limited thereto, when an EPI is extended and/or lengthened, the reliability of the data stored in the flash memory device may be degraded and/or decreased, etc. For example, holes may spread to a space area between adjacent memory cells during a period after an erase operation is performed and until a another program operation (e.g., a programming operation, a write operation, etc.) is performed. When data is programmed in a state in which the EPI is relatively long, electrons and holes may be recombined after the program operation is performed. Thus, a distribution of threshold voltages of the memory cells may be shifted, as described in detail with reference to FIG. 2.

Figure 2:
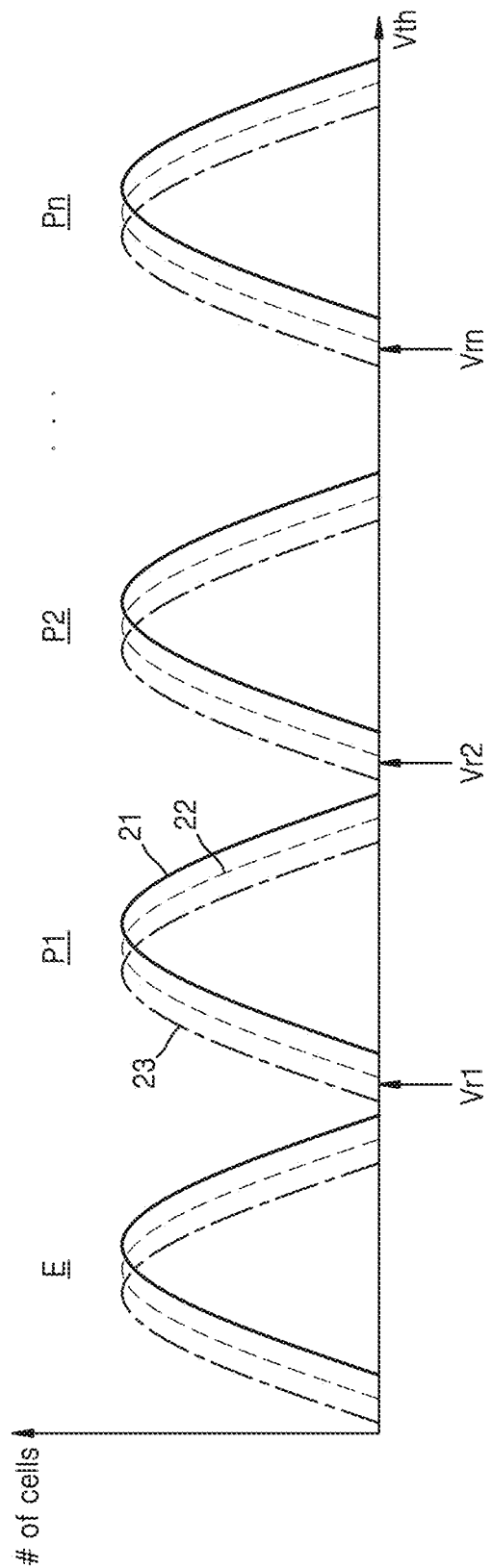
FIG. 2 is an example graph showing threshold voltage distribution characteristics due to an erase program interval (EPI) of a non-volatile memory (NVM) of FIG. 1 according to at least one example embodiment.

FIG. 2 is a graph exemplarily showing threshold voltage distribution characteristics due to EPIs of the NVM 200 of FIG. 1 according to at least one example embodiment.

Referring to FIG. 2, the abscissa denotes a threshold voltage, and the ordinate denotes the number of memory cells. In a first case 21, in which a program operation (e.g., a programming operation, etc.) is performed immediately after a block is erased, that is, when the EPI is almost 0, memory cells may have one of an erase state E and first to n-th program states P1 to Pn according to (and/or based on) a threshold voltage. For example, read voltage levels of the first and second program states P1 and P2 may be set as desired, defined, and/or previously defined as Vr1 and Vr2, respectively.

In a second case 22, in which a program operation is performed during a first period after a block is erased, that is, when the EPI is relatively short, a distribution of threshold voltages may be generally shifted leftward (or in a direction in which a threshold voltage level is reduced), when compared to the first case 21. In a third case 23, in which a program operation is performed during a second period after a block is erased, that is, when the EPI is relatively long, a distribution of threshold voltages may be generally shifted further leftward (or in a direction in which a threshold voltage level is reduced), when compared to the second case 22. Here, the second period may be longer than the first period, but the example embodiments are not limited thereto.

As described above, when data is programmed in a state in which an EPI is relatively long (and/or comparatively longer than a desired or default EPI), threshold voltage distribution characteristics may be degraded as compared to a case in which data is programmed in a state in which an EPI is relatively short (and/or comparatively shorter than a desired or default EPI). In this case, when a read operation is performed on memory cells using a desired, defined, and/or previously defined read voltage levels Vr1, Vr2, . . . , and Vrn, a read error may occur, and thus, the reliability of data stored in the memory cells may be degraded and/or decreased. In addition, when a block detected as having a long EPI is not used to reduce and/or prevent the reliability degradation due to the EPI, a storage space of the NVM 200 may not be efficiently used and garbage collection operations may be frequently caused to perform, is desired, and/or is required, and thus, the lifespan of the NVM 200 may be reduced.

Referring back to FIG. 1, to overcome the above-described drawbacks, the memory controller 100 may include an EPI checker circuitry 110 and/or a program mode control circuitry 120, etc. The EPI checker circuitry 110 may detect an EPI of a memory group during an operation of writing data, such as user data or meta data, but is not limited thereto. For example, the EPI checker circuitry 110 may detect the EPI of the memory group during a garbage collection operation, memory erase operation, etc. Additionally, the memory group may be a memory block, a memory stack, and/or a sub-memory block included in the memory cell array 210, etc. However, the example embodiments of the inventive concepts are not limited thereto, and the EPI checker circuitry 110 may detect the EPI of the memory group in various situations where a program operation for the memory group is desired and/or required. According to at least one example embodiment, the EPI checker circuitry 110 may include hardware including logic circuits; a hardware/software combination such as a processor executing software; or a combination thereof. For example, the EPI checker circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The program mode control circuitry 120 may determine one of a plurality of program modes to be a program mode for the memory group, based on the detected EPI. The plurality of program modes may be set, defined, and/or previously defined according to (and/or based on) a data bit number stored in each memory cell. For example, the plurality of program modes may include at least one of a quadruple-level cell (QLC) mode, a triple-level cell (TLC) mode, a multi-level cell (MLC) mode, and a single-level cell (SLC) mode, etc., but is not limited thereto. The plurality of program modes will be described below with reference to FIGS. 4A to 4D. Furthermore, the program mode control circuitry 120 may control the program operation for the memory group in the determined program mode. Accordingly, even if data is written in a memory group having a long EPI, the degradation of the reliability of the data may be reduced and/or prevented. According to at least one example embodiment, the program mode control circuitry 120 may include hardware including logic circuits; a hardware/software combination such as a processor executing software; or a combination thereof. For example, the program mode control circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. Additionally, according to at least one example embodiment, the EPI checker circuitry 110 and the program mode control circuitry 120 may be implemented as and/or combined into a single circuitry.

In some example embodiments, the memory system 10 may be an internal memory that is embedded in an electronic device. For example, the memory system 10 may be an SSD, an embedded universal flash storage (UFS) memory device, and/or an embedded multi-media card (eMMC), etc., but is not limited thereto. In some example embodiments, the memory system 10 be an external memory that is detachably attached to an electronic device. For example, the memory system 10 may include a UFS memory card, a compact flash (CF) memory, a secure digital (SD) memory, a micro-SD memory, a mini-SD memory, an extreme digital (xD) memory, and/or a memory stick, etc.

The memory system 10 and the host HOST may constitute a storage system, but the example embodiments are not limited thereto. The storage system may be implemented as, for example, a personal computer (PC), a data server, a network-coupled storage, an Internet of Things (IoT) device, and/or a portable electronic device, etc. The portable electronic device may be a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MPEG-1 audio layer 3 (MP3) player, a handheld game console, an electronic book (e-book), a virtual reality device, an augmented reality device, an autonomous vehicle, and/or a wearable device, etc.

Figure 3:
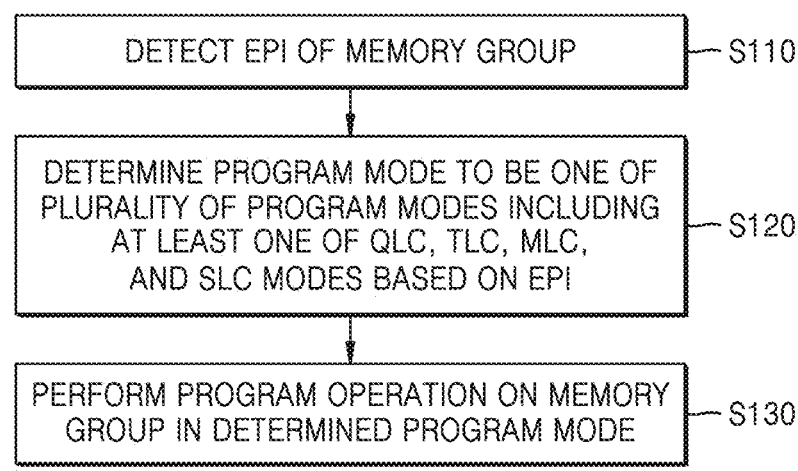
FIG. 3 is a flowchart of a method of operating a memory system, according to at least one example embodiment.

FIG. 3 is a flowchart of a method of operating a memory system, according to at least one example embodiment. Referring to FIG. 3, the operating method according to the present example embodiment may be a method of programming a memory system to improve threshold voltage distribution characteristics. For example, the operating method according to the present example embodiment may include operations performed in a temporal sequence in the memory system 10 of FIG. 1.

In operation S110, the memory controller 100 may detect an EPI of the memory group. For example, the EPI checker circuitry 110 may include a timer (not shown), which may detect a time period (e.g., a duration) from a time point at which an erase operation, or other operation, is performed on the memory group to a time point at which a program operation is performed on the memory group, as the EPI of the memory group. In operation S120, the memory controller 100 may determine a program mode to be one of a plurality of program modes including for example, a QLC mode, a TLC mode, a MLC mode, and/or a SLC mode, etc., based on the detected EPI. For example, the program mode control circuitry 120 may compare the detected EPI with a desired and/or (previously) defined reference time and select one of the plurality of program modes. In other words, a program mode may be selected based on the detected EPI and a desired reference time. In operation S130, the memory controller 100 may perform a program operation for the memory group in the determined program mode, including adjusting at least one voltage level associated with the program operation (e.g., adjust one or more write voltages associated with a write operation) based on the determined program mode.

FIGS. 4A to 4D are examples of graphs showing distributions of threshold voltages of memory cells that are programmed to an SLC mode, an MLC mode, a TLC mode, and a QLC mode, respectively, however the example embodiments are not limited thereto and, for example, the memory cells may operate under other NAND/flash memory program modes. In FIGS. 4A to 4D, the abscissa denotes a threshold voltage, and the ordinate denotes the number of memory cells.

Figure 4A:
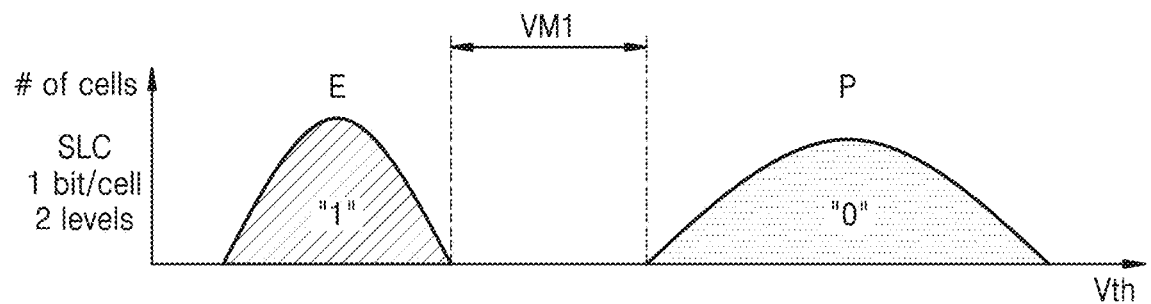

Referring to FIG. 4A, the single-level cell (SLC) mode may be a program mode in which 1-bit data is stored in each memory cell, and each memory cell may be programmed to an SLC mode in which the memory cell may have one of two states dependent on (e.g., based on) a distribution of threshold voltages. For example, a memory cell configured to store data '1' may be in an erase state E, and a memory cell configured to store data '0' may be in a program state P, however the example embodiments are not limited thereto and the data values may correspond to other program modes.

Figure 4B:
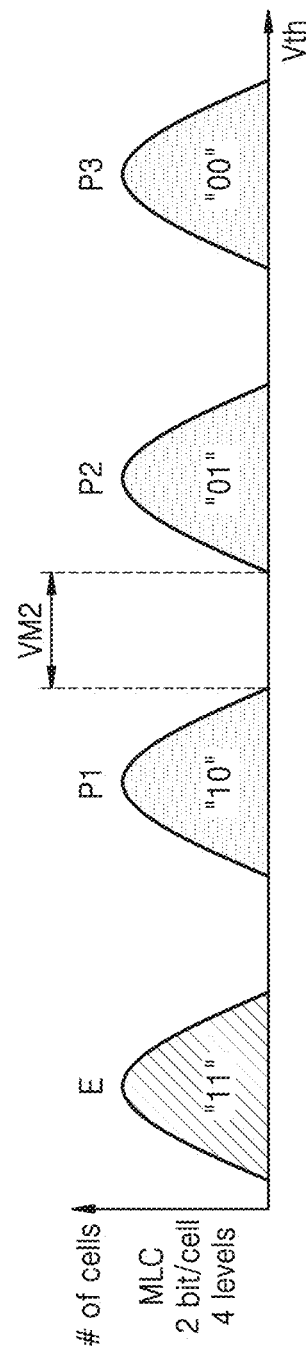

Referring to FIG. 4B, the multi-level cell (MLC) mode may be a program mode in which 2-bit data is stored in each memory cell, and each memory cell may be programmed to an MLC mode in which the memory cell may have one of four states depending on a distribution of threshold voltages. For example, a memory cell configured to store data '11' may be in an erase state E, and memory cells configured to respectively store data '10,' '01,' and '00' may be in first to third program states P1 to P3, respectively, however the example embodiments are not limited thereto and the data values may correspond to other program modes.

Referring to FIG. 4C, the triple-level cell (TLC) mode may be a program mode in which 3-bit data is stored in each memory cell, and each memory cell may be programmed to a TLC mode in which the memory cell may have one of eight states depending on a distribution of threshold voltages. For example, a memory cell configured to store data '111' may be in an erase state E, and memory cells configured to respectively store data '110,' '101,' '100,' '011,' '010,' '001,' and '000' may be in first to seventh program states P1 to P7, respectively, however the example embodiments are not limited thereto and the data values may correspond to other program modes.

Figure 4D:
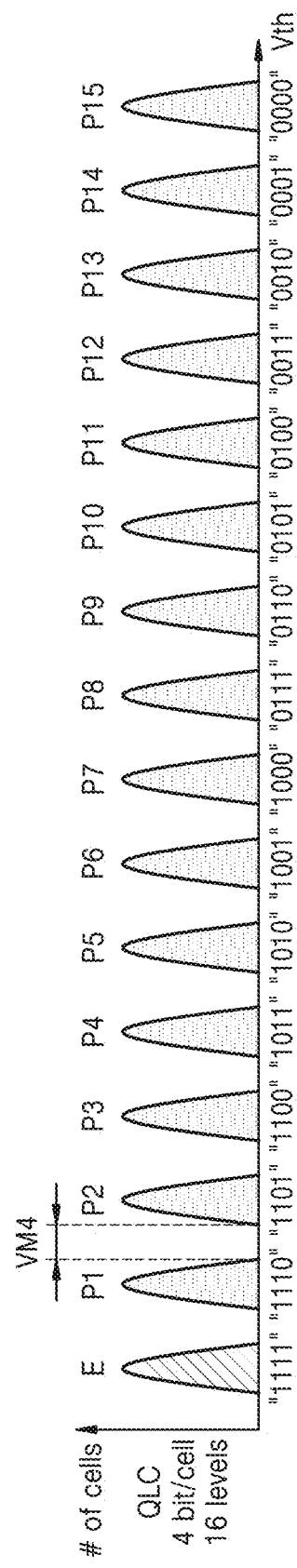

Referring to FIG. 4D, the quadruple-level cell (QLC) mode may be a program mode in which 4-bit data is stored in each memory cell, and each memory cell may be programmed to a QLC mode in which the memory cell may have one of 16 states depending on a distribution of threshold voltages. For example, a memory cell configured to store data '1111' may be in an erase state E, and memory cells configured to respectively store data '1110,' '1101,' '1100,' '1011,' '1010,' '1001,' '1000,' '0111,' '0110,' '0101,' '0100,' '0011,' '0010,' '0001,' and '0000' may be in first to fifteenth program states P1 to P15, respectively, however the example embodiments are not limited thereto and the data values may correspond to other program modes.

Referring to FIGS. 4A to 4D, an interval between two adjacent states (i.e., two valleys) may be defined as a "valley margin." In memory cells that are programmed to the SLC mode, a first valley margin VM1 may be present between the erase state E and the program state P. In memory cells that are programmed to the MLC mode, a second valley margin VM2, which is smaller than the first valley margin VM1, but is not limited thereto, may be present between the first and second program states P1 and P2. In memory cells that are programmed to the TLC mode, a third valley margin VM3, which is smaller than the second valley margin VM2, but is not limited thereto, may be present between the first and second program states P1 and P2. In memory cells that are programmed to the QLC mode, a fourth valley margin VM4, which is smaller than the third valley margin VM3, but is not limited thereto, may be present between the first and second program states P1 and P2. As described above, according to at least one example embodiment, a valley margin may be gradually reduced from the SLC mode toward the QLC mode, however the example embodiments are not limited thereto, and for example, the valley margins may be equal or greater than previous valley margins.

As described above with reference to FIG. 2, according to at least one example embodiment, a distribution of threshold voltages of memory cells that are programmed due to an EPI may be shifted leftward, or in other words, the distribution of threshold voltages is reduced and/or adjusted based on the EPI. Accordingly, a program operation may be performed on a block having a short EPI in a program mode (e.g., a QLC mode, etc.) having a relatively small valley margin in comparison to the valley margins of the other program modes, while a program operation may be performed on a block having a long EPI in a program mode (e.g., an SLC mode, etc.) having a relatively large valley margin in comparison to the valley margins of the other program modes. This will be described below with reference to FIGS. 8 to 13.

Figure 5:
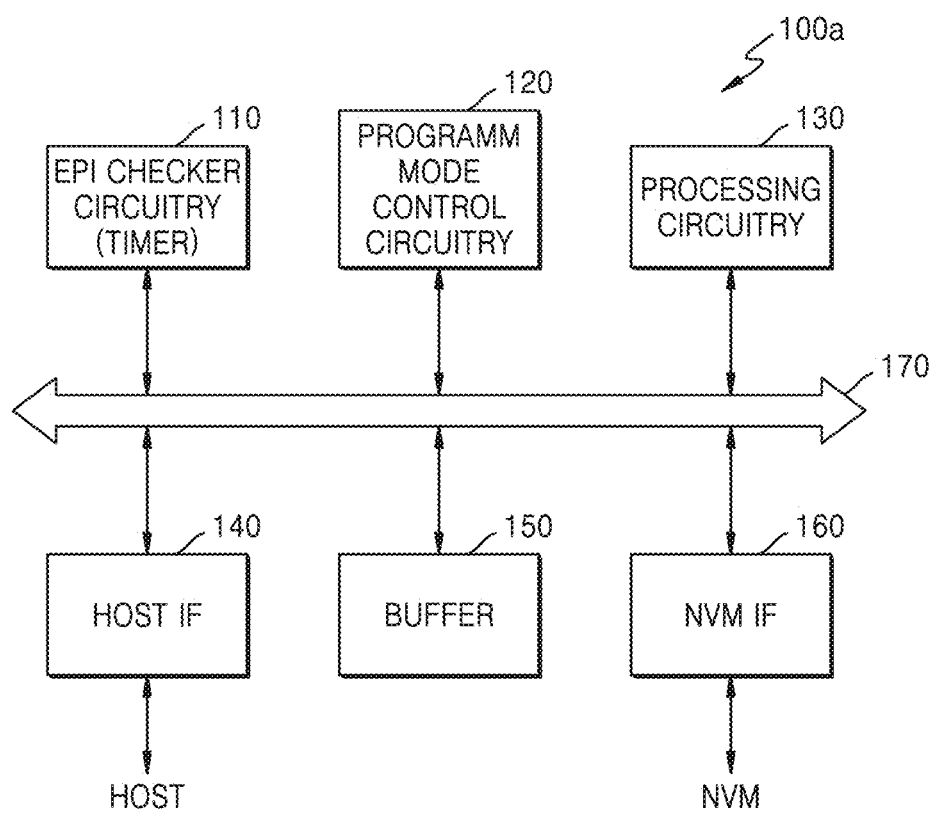
FIG. 5 is a block diagram of a memory controller of FIG. 1, according to at least one example embodiment.

FIG. 5 is a block diagram of an example of the memory controller 100 of FIG. 1, according to at least one example embodiment.

Referring to FIG. 5, a memory controller 100a may include an EPI checker circuitry 110, a program mode control circuitry 120, processing circuitry 130, a host interface 140, a buffer 150, and/or an NVM interface 160, etc., but is not limited thereto. Additionally, the memory controller 100a may further include a bus 170 through which the components of the memory controller 100a may communicate with each other. The above description presented with reference to FIGS. 1 and 5 may be applied to the one or more other example embodiments, and a repeated description thereof will be omitted. However, the example embodiments are not limited thereto, and the example embodiments may have an alternate hardware structure than the hardware structure of FIGS. 1 and 5.

The EPI checker circuitry 110 may include at least one timer and detect an EPI of each of memory groups included in a memory cell array 210 of an NVM 200. In at least one example embodiment, at least one timer included in the EPI checker circuitry 110 may be shared among a plurality of memory groups. In at least one example embodiment, the EPI checker circuitry 110 may include timers corresponding respectively to the plurality of memory groups. However, the inventive concepts is not limited thereto, and the EPI checker circuitry 110 may be defined as including various other circuits, components, and/or computer readable instructions capable of measuring time. For example, when the EPI checker circuitry 110 measures time based on counting the cycles of a clock signal generated by a clock generator (not shown), the EPI checker circuitry 110 may also include a counter, etc.

The program mode control circuitry 120 may determine a program mode for a memory group to be one of a plurality of program modes including at least one of a QLC mode, a TLC mode, an MLC mode, and an SLC mode, based on a detection result of the EPI checker circuitry 110. In at least one example embodiment, the program mode control circuitry 120 may be implemented as software or firmware (e.g., computer readable instructions, etc.), loaded in a memory of the memory controller 100a, and executed by the processing circuitry 130. In at least one example embodiment, the program mode control circuitry 120 may be implemented as hardware.

The processing circuitry 130 may include a central processing unit (CPU), a microprocessor (MP), an arithmetic logic unit (ALU), a digital signal processor, a microcomputer, a field programmable gate array (FPGA), a System-on-Chip (SoC), a programmable logic unit, application-specific integrated circuit (ASIC), etc., and/or may be a hard-wired circuit including logic circuits, or combinations thereof, but the example embodiments are not limited thereto. The processing circuitry 130 may control the overall operation of the memory controller 100a. In at least one example embodiment, the processing circuitry 130 may be implemented as a multi-core processor, for example, a dual-core processor, a quad-core processor, etc. According to at least on example embodiment, the processing circuitry 130 may include, replace, and/or perform the functionality of, at least one of the EPI checker circuitry 110 and the program mode control circuitry 120.

The host interface 140 may provide a physical connection between a host (e.g., an external device, a computing device, etc.) and the memory controller 100. For example, the host interface 140 may include various interface methods, such as advanced technology attachment (ATA), serial ATA (SATA), external SATA (e-SATA), small computer system interface (SCSI), serial attached SCSI (SAS), peripheral component interconnection (PCI), PCI express (PCI-E), IEEE 1394, universal serial bus (USB), a secure digital (SD) card, a multi-media card (MMC), an embedded multi-media card (eMMC), and/or a compact flash (CF) card interface, but is not limited thereto.

The NVM interface 160 may provide a physical connection between the memory controller 100 and the NVM 200. For example, a command CMD, an address ADDR, and/or data DATA, etc., signals may be transmitted and/or received between the memory controller 100 and the NVM 200 through the NVM interface 160. Data requested to be written from the host and data read from the NVM 200 may be temporarily stored in the buffer 150.

Figure 6:
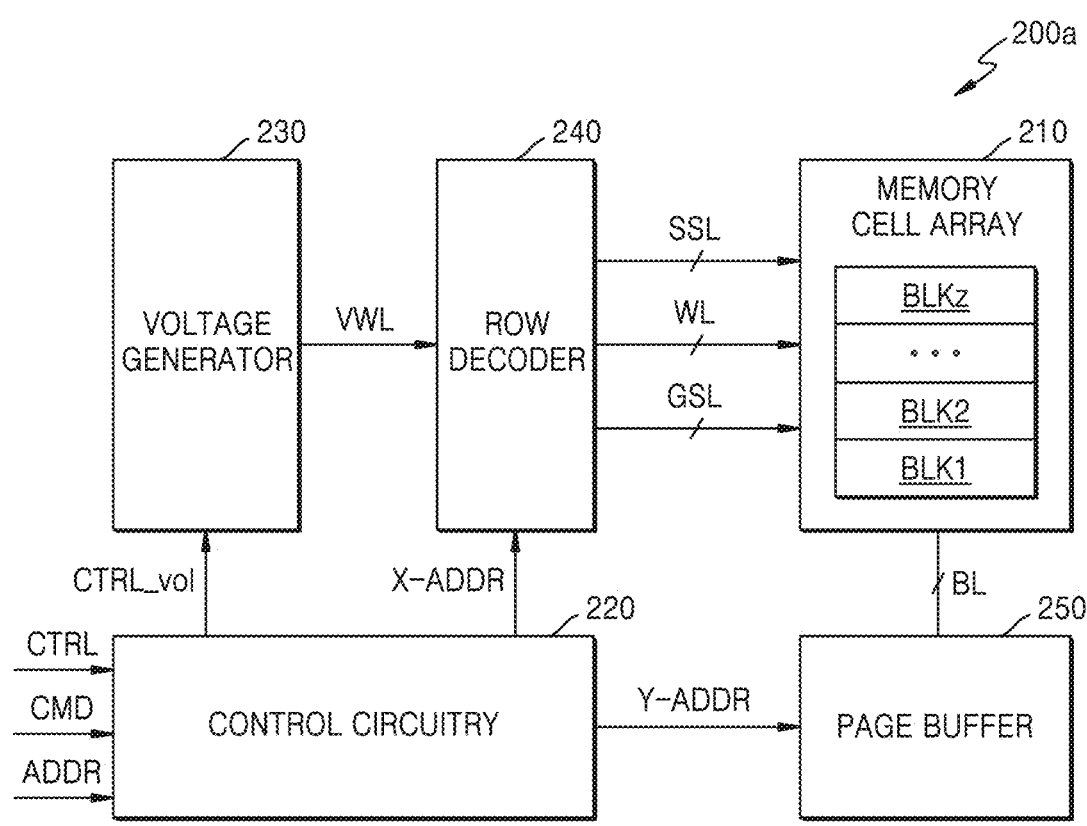
FIG. 6 is a block diagram of a non-volatile memory (NVM) of FIG. 1, according to at least one example embodiment.

FIG. 6 is a block diagram of an example of the NVM 200 of FIG. 1, according to at least one example embodiment.

Referring to FIG. 6, an NVM 200a may include a memory cell array 210, a control circuitry 220, a voltage generator 230, a row decoder 240, and/or a page buffer 250. Although not shown in FIG. 6, the NVM 200a may further include various other components related to a memory operation(s), such as a data I/O circuit, an I/O interface, etc.

The memory cell array 210 may include a plurality of blocks BLK1 to BLKz, and memory cells of the blocks BLK1 to BLKz may be connected to word lines WL, string selection lines SSL, ground selection lines GSL, and/or bit lines BL, etc. The memory cell array 210 may be connected to the row decoder 240 through the word lines WL, the string selection lines SSL, and/or the ground selection lines GSL, etc., and may be connected to the page buffer 250 through the bit lines BL. Each of the memory cells may store at least one bit. In at least one example embodiment, each of the memory cells may correspond to an SLC, an MLC, a TLC, or a QLC.

In at least one example embodiment, the memory cell array 210 may include a two-dimensional (2D) memory cell array, which includes a plurality of cell strings arranged in a row direction and a column direction, but the example embodiments are not limited thereto, and for example, the memory cell array may have other arrangements, such as a three-dimensional (3D) memory cell array, which includes a plurality of cell strings, etc. Each of the cell strings may include memory cells respectively connected to word lines stacked on a substrate in, for example, a perpendicular direction. The following patent documents, which are hereby incorporated by reference, disclose suitable configurations for 3D memory cell arrays, in which the 3D memory cell array is configured at a plurality of levels, with word lines and/or bit lines shared between levels: U.S. Pat. Nos. 7,679,133; 8,553,466; 8,654,587; 8,559,235; and US Pat. Pub. No. 2011/0233648.

The control circuitry 220 may output various internal control signals for programming data to the memory cell array 210 or reading data from the memory cell array 210 based on a command CMD, an address ADDR, and/or a control CTRL, etc., signals which are received from the memory controller 100. As an example, the control circuitry 220 may output a voltage control signal CTRL_vol for controlling levels of various voltages generated by the voltage generator 230, provide a row address X-ADDR to the row decoder 240, and provide a column address Y-ADDR to the page buffer 250, etc.

The voltage generator 230 may generate various kinds of voltages for performing program, read, and/or erase operations, etc., on the memory cell array 210, based on the voltage control signal CTRL_vol. For example, the voltage generator 230 may generate word line voltages VWL, for example, a program voltage, a read voltage, and a program verification voltage, etc. In response to the row address X-ADDR, the row decoder 240 may select one of a plurality of word lines WL and select one of a plurality of string selection lines SSL. The page buffer 250 may select some bit lines out of the bit lines BL in response to the column address Y-ADDR. For example, the page buffer 250 may operate as a write driver, and/or a sense amplifier depending on an operation mode, etc.

In at least one example embodiment, the control circuitry 220 may generate a voltage control signal CTRL_vol to perform a program operation for a memory group, according to and/or based on a program mode corresponding to the memory group. For instance, when the program mode is an MLC mode, as shown in FIG. 4B, the control circuitry 220 may generate a voltage control signal CTRL_vol for generating the program voltage and the program verification voltage such that a memory cell is programmed to, for example, one of first to third program states P1 to P3, but is not limited thereto. For example, when the program mode is a QLC mode, as shown in FIG. 4D, the control circuitry 220 may generate a voltage control signal CTRL_vol for generating the program voltage and the program verification voltage such that a memory cell is programmed to one of first to fifteenth program states P1 to P15, etc.

In at least one example embodiment, the control circuitry 220 may generate a voltage control signal CTRL_vol to perform a read operation on a memory group according to and/or based on a program mode corresponding to the memory group. For example, when the program mode is a TLC mode, as shown in FIG. 4C, the control circuitry 220 may generate a voltage control signal CTRL_vol corresponding to a read voltage for reading the first to seventh program states P1 to P7, but the example embodiments are not limited thereto. For example, when the program mode is a QLC mode, as shown in FIG. 4D, the control circuitry 220 may generate a voltage control signal CTRL_vol corresponding to a read voltage for reading the first to fifteenth program states P1 to P15, etc.

Figures 7, 8:
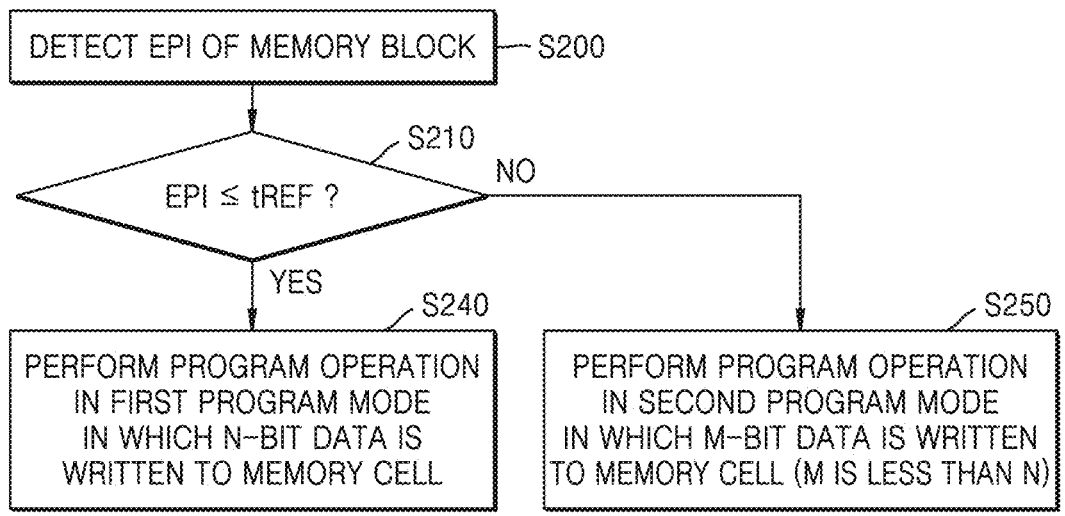
FIG. 7 shows an EPI table according to at least one example embodiment.
FIG. 8 is a flowchart of a method of operating a memory system, according to at least one example embodiment.

FIG. 7 illustrates an EPI table ET1 according to at least one example embodiment.

Referring to FIG. 7, the EPI table ET1 may store EPI information corresponding to each of a plurality of memory blocks. Hereinafter, a memory block will be referred to as a block for brevity. For example, EPI information about a first block BLK1 may be stored as t1, and EPI information about a second block BLK2 may be stored as t2, etc. In at least one example embodiment, the EPI table ET1 may be stored in a meta region of the NVM 200, but is not limited thereto and may be stored in other memory regions and/or memory devices. In at least one example embodiment, the EPI table ET1 may be stored in dynamic random access memory (DRAM) of the memory system 10. In at least one example embodiment, the EPI table ET1 may be stored in static RAM (SRAM) of the memory controller 100. Hereinafter, at least one example embodiment in which EPI information is managed for each block will mainly be described with reference to FIGS. 8 to 16.

Figure 9:
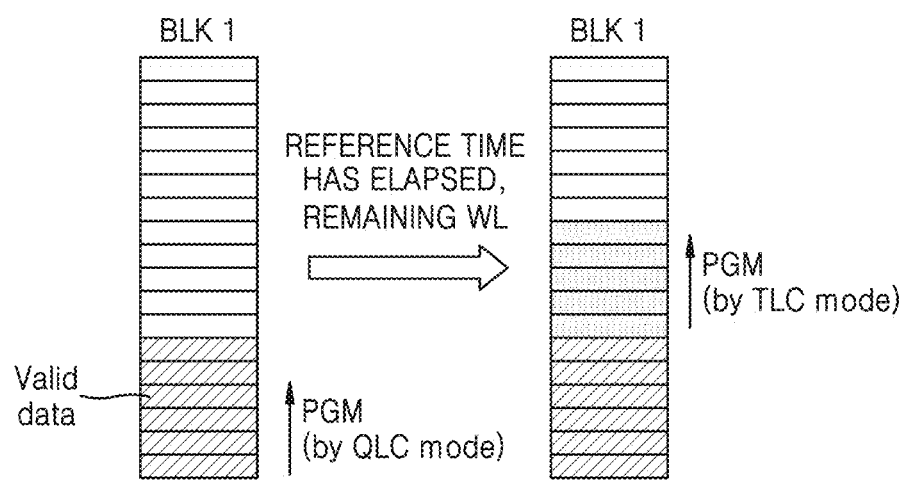
FIG. 9 is a conceptual diagram of a program operation for a memory block in the operating method of FIG. 8, according to at least one example embodiment.

FIG. 8 is a flowchart of a method of operating a memory system, according to at least one example embodiment. FIG. 9 is a conceptual diagram of a program operation for a memory block in the operating method of FIG. 8, according to at least one example embodiment.

Referring to FIGS. 1, 8, and 9, in operation S200, the memory system 10 may detect an EPI of the memory block. For example, when a data write request for a first block BLK1 is received, the memory system 10 may detect an EPI of the first block BLK1. In operation S210, the memory system 10 may determine if the detected EPI is equal to, or shorter than, a reference time tREF. If it is determined that the detected EPI is equal to, or shorter than, the reference time tREF, operation S240 may be performed; otherwise, operation S250 may be performed. In other words, the memory system 10 may determine whether to perform operation S240 based on the length of the detected EPI.

When the detected EPI is equal to, or shorter than, the reference time tREF, in operation S240, the memory system 10 may perform a program operation in a first program mode in which N-bit data is written to a memory cell (N is a positive integer). For example, N may be 4, and the first program mode may be a QLC mode, but the example embodiments are not limited thereto. For example, when the EPI of the first block BLK1 is equal to, or shorter than, the reference time tREF, the memory system 10 may perform a program operation on some pages of the first block BLK1 in the QLC mode, etc.

Otherwise, if the detected EPI exceeds the reference time tREF, in operation S250, the memory system 10 may perform a program operation in a second program mode in which M-bit data is written to a memory cell (M is a positive integer less than N). For example, M may be 3, and the second program mode may be a TLC mode, but the example embodiments are not limited thereto. For example, when the EPI of the first block BLK1 exceeds the reference time tREF, the memory system 10 may perform a program operation on some of the remaining pages of the first block BLK1 in the TLC mode, etc.

In at least one example embodiment, after the program operation on the some pages of the first block BLK1 in the QLC mode, the writing of the first block BLK1 may be requested again after a desired and/or predetermined time has elapsed. Accordingly, an EPI of the first block BLK1 may be detected again, and an EPI may pass the reference time tREF at a time point when the EPI of the first block BLK1 is detected again. In this case, a program operation may be performed on some of the remaining pages of the first block BLK1 in the TLC mode, etc.

Figure 10:
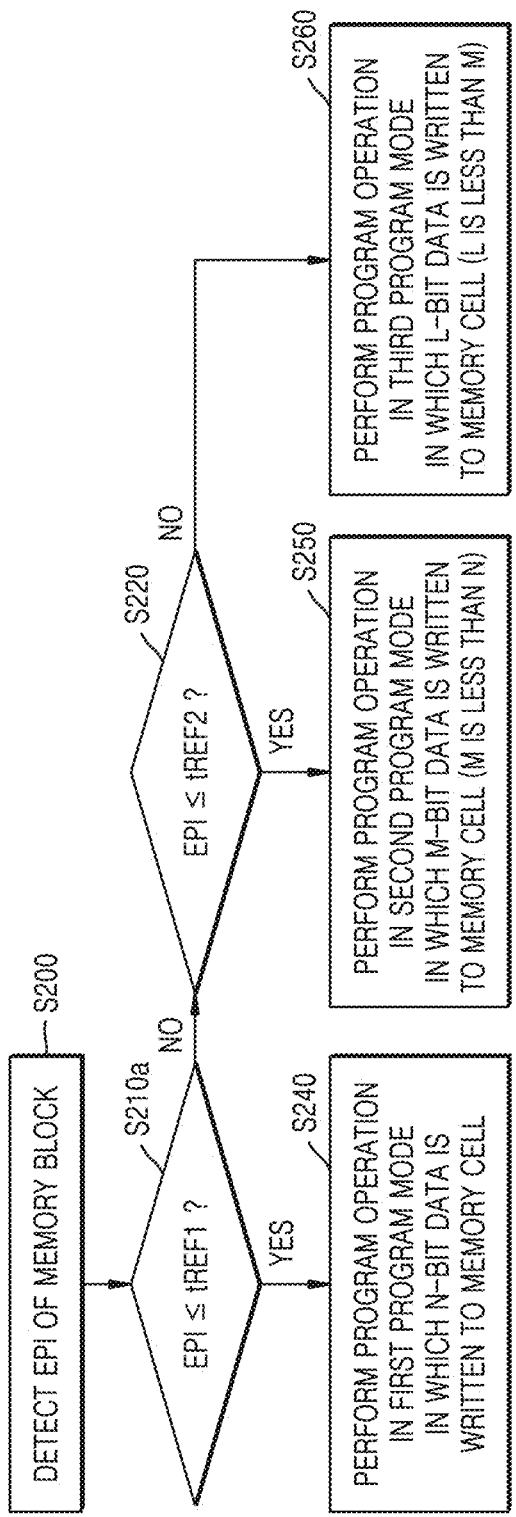
FIG. 10 is a flowchart of a method of operating a memory system, according to at least one example embodiment.
Figure 11:
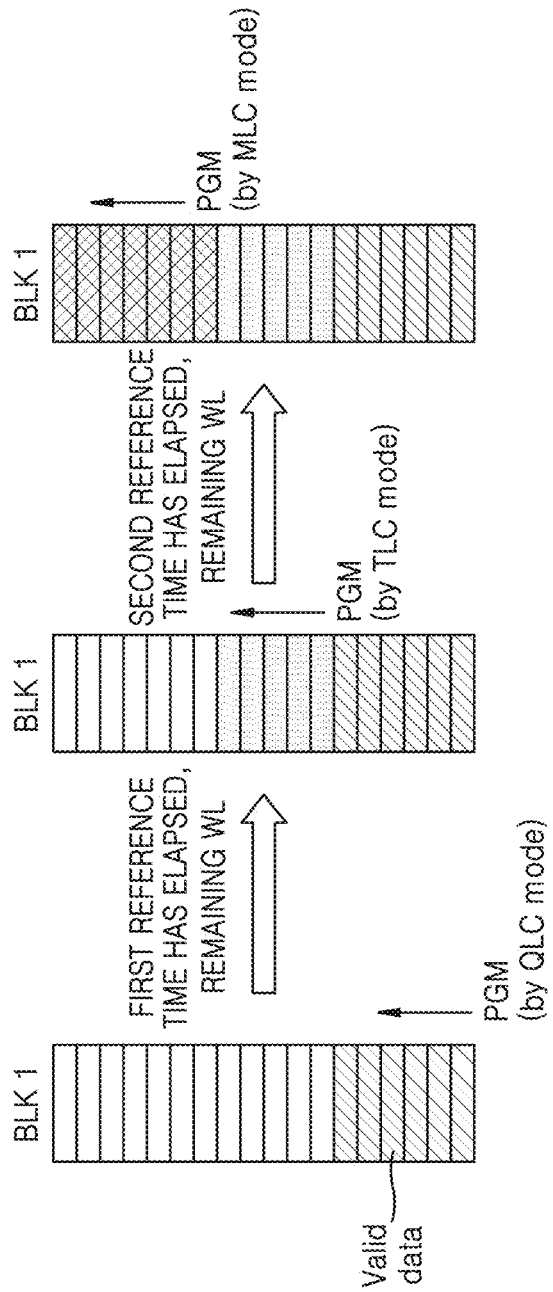
FIG. 11 is a conceptual diagram of a program operation for a memory block in the operating method of FIG. 10, according to at least one example embodiment.

FIG. 10 is a flowchart of a method of operating a memory system 10, according to at least one example embodiment. FIG. 11 is a conceptual diagram of a program operation for a memory block in the operating method of FIG. 10, according to at least one example embodiment.

Referring to FIGS. 1, 10, and 11, the operating method according to the present example embodiment may correspond to a modified example of the operating method shown in FIG. 8, and a repeated description thereof will be omitted. In operation S210a, the memory system 10 may determine if a detected EPI is equal to, or shorter than, a first reference time tREF1. For example, the first reference time tREF1 may be about 25 minutes, but is not limited thereto, and the reference time may be set to any desired time. If it is determined that the detected EPI exceeds the first reference time tREF1, the memory system 10 may determine if the detected EPI is equal to, or shorter than, a second reference time tREF2 in operation S220. For example, the second reference time tREF2 may be three hours, etc. If it is determined that the detected EPI is equal to, or shorter than, the second reference time tREF2, operation S250 may be performed; otherwise, operation S260 may be performed.

In operation S250, the memory system 10 may perform a program operation in a second program mode in which M-bit data is written to a memory cell. In operation S260, the memory system 10 may perform a program operation in a third program mode in which L-bit data is written to a memory cell. (here, L is a positive integer less than M). For example, L may be 2, and the third program mode may be an MLC mode, but the example embodiments are not limited thereto. For example, when an EPI of a first block BLK1 exceeds the second reference time tREF2, a program operation may be performed on some of the remaining pages of the first block BLK1 in the MLC mode, etc.

Figure 12:
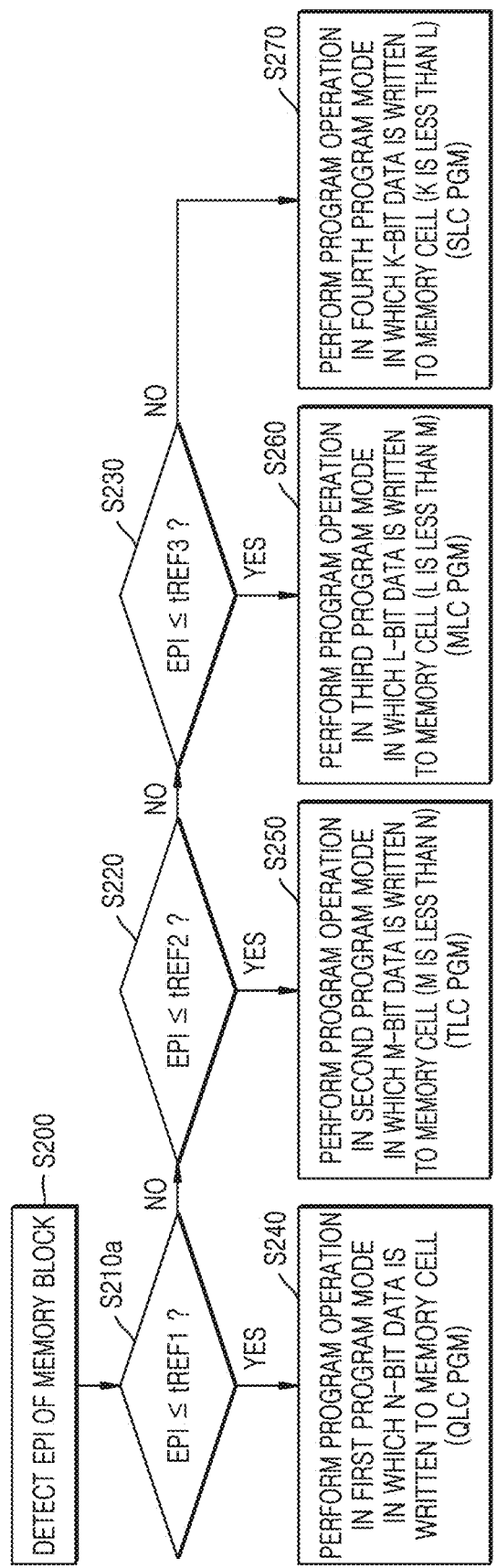
FIG. 12 is a flowchart of a method of operating a memory system, according to at least one example embodiment.
Figure 13:
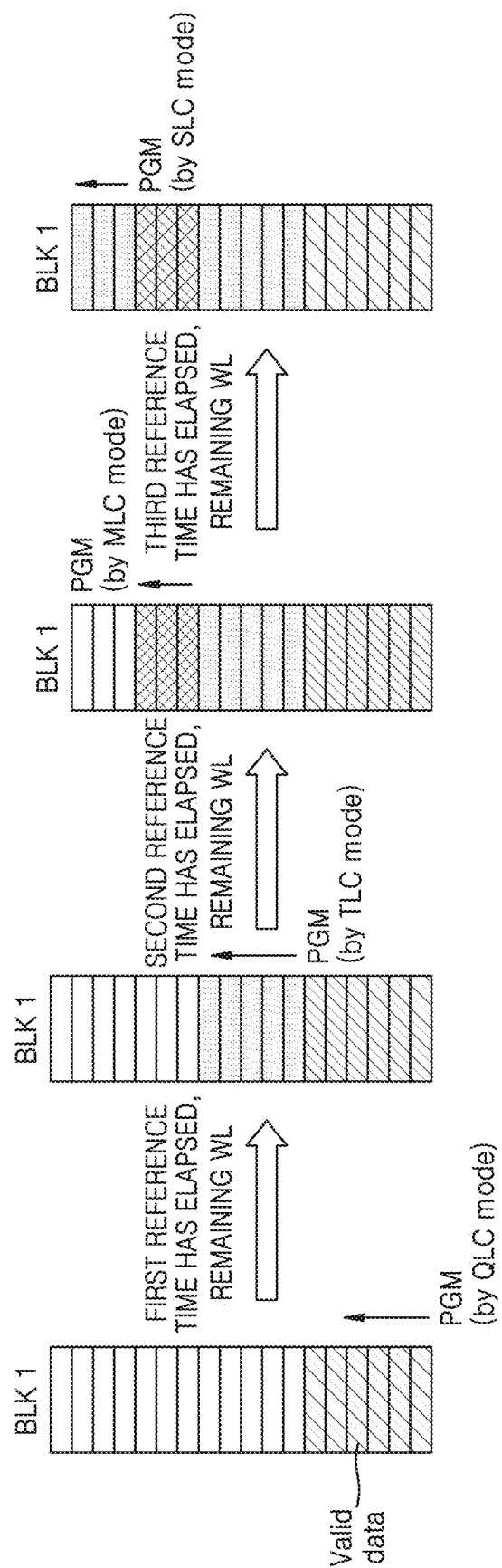
FIG. 13 is a conceptual diagram of a program operation for a memory block in the operating method of FIG. 12, according to at least one example embodiment.

FIG. 12 is a flowchart of a method of operating a memory system, according to at least one example embodiment. FIG. 13 is a conceptual diagram of a program operation for a memory block in the operating method of FIG. 12, according to at least one example embodiment.

Referring to FIGS. 1, 12, and 13, the operating method according to the example embodiments of FIGS. 1, 12, and 13 may correspond to a modified example embodiment of the operating method shown in FIG. 10, and a repeated description thereof will be omitted. In operation S220, the memory system 10 may determine if a detected EPI is equal to, or shorter than, a second reference time tREF2. If it is determined that the detected EPI exceeds the second reference time tREF2, in operation S230, the memory system 10 may determine if the detected EPI is equal to, or shorter than, a third reference time tREF3. For example, the third reference time tREF3 may be 24 hours, but is not limited thereto. If it is determined that the detected EPI is equal to, or shorter than, the third reference time tREF3, operation S260 may be performed; otherwise, operation S270 may be performed.

In operation S260, the memory system 10 may perform a program operation in a third program mode in which L-bit data is written to a memory cell. In operation S270, the memory system 10 may perform a program operation in a fourth program mode in which K-bit data is written to a memory cell (K is a positive integer less than L). For example, K may be 1, and the fourth program mode may be an SLC mode, but the example embodiments are not limited thereto. For example, when the EPI of the first block BLK1 exceeds the third reference time tREF3, the memory system 10 may perform a program operation on some of the remaining pages of the first block BLK1 in the SLC mode, but the example embodiments are not limited thereto.

Figure 14:
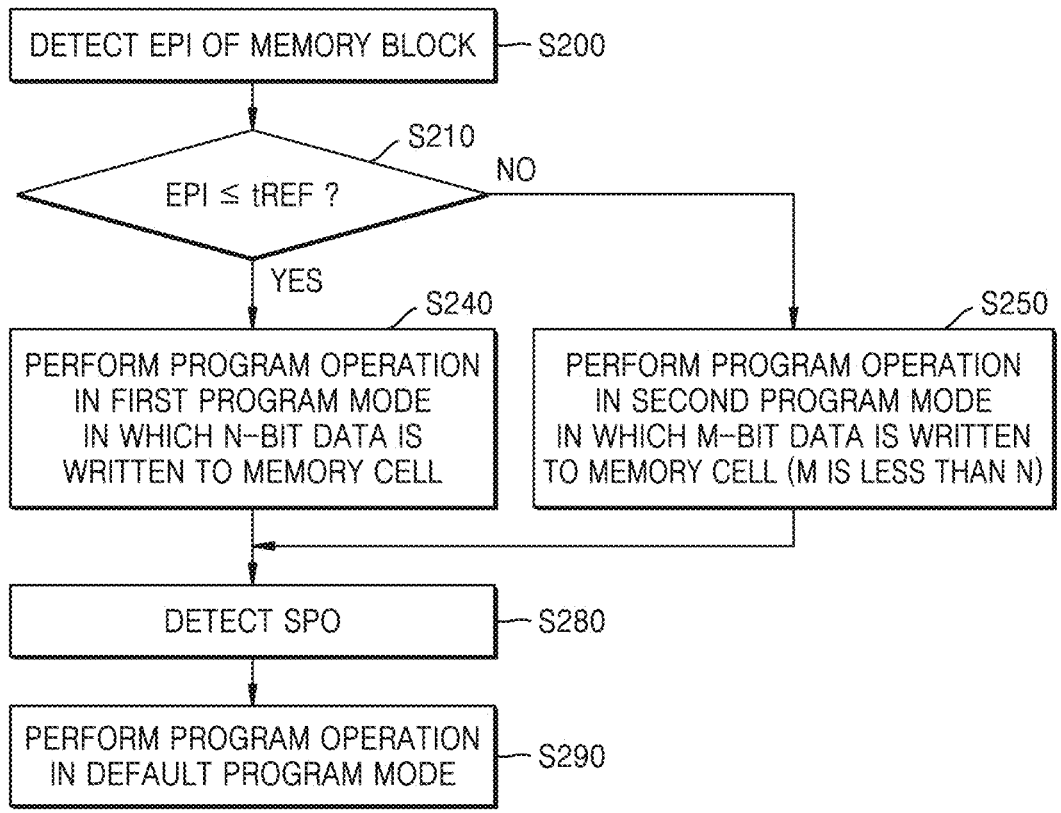
FIG. 14 is a flowchart of a method of operating a memory system, according to at least one example embodiment.
Figure 15:
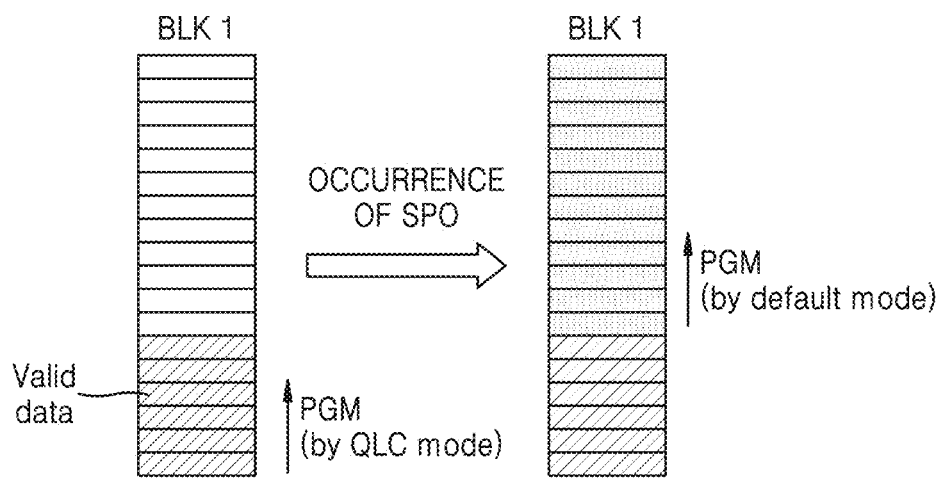
FIG. 15 is a conceptual diagram of a program operation for a memory block in the operating method of FIG. 14, according to at least one example embodiment.

FIG. 14 is a flowchart of a method of operating a memory system, according to at least one example embodiment. FIG. 15 is a conceptual diagram of a program operation for a memory block in the operating method of FIG. 14, according to at least one example embodiment.

Referring to FIGS. 1, 14, and 15, the operating method according to the at least one example embodiment may correspond to a modified example of the operating method shown in FIG. 8, and the above descriptions presented with reference to FIGS. 8 and 9 may also be applied to the present example embodiment. For example, the operating method according to FIGS. 1, 14, and 15 may further include operations S280 and S290 as compared with the operating method of FIG. 8. However, the example embodiments of the inventive concepts are not limited thereto. In some example embodiments, an operating method may further include operations S280 and S290 as compared to the operating method of FIG. 10 or FIG. 12, etc.

In operation S290, the memory system 10 may perform a program operation in a default program mode. For example, after sudden power-off (SPO) event occurs during a program operation on a first block BLK1, when power is applied again, a program operation may be performed on some of the remaining pages of the first block BLK1 in a default program mode (e.g., an SLC mode, etc.).

Due to the occurrence of SPO, a timer for detecting EPIs of memory groups may be reset and/or information indicating erase time points of the memory groups may be deleted.

For these reasons, the accuracy of EPI information of the memory device may be lowered. Accordingly, when a program operation is performed on a memory group after the occurrence of SPO, the program operation may be performed on a corresponding memory block in a default program mode assuming that a large amount of time has elapsed since an erase time point of the corresponding memory block. For example, the default program mode may be an SLC mode or MLC mode having a relatively large valley margin, but the example embodiments are not limited thereto.

FIGS. 16A and 16B show program mode tables PMT1 and PMT1' according to some example embodiments.

Referring to FIG. 16A, the program mode table PMT1 may store program modes corresponding respectively to a plurality of logical page numbers (LPNs). In some example embodiments, the program mode table PMT1 may store a program mode for each LPN group describing a start LPN and an end LPN. For example, a program mode for a first LPN LPN1 may be determined to be a QLC mode, and a program mode for a second LPN LPN2 may be determined to be an MLC mode, but the example embodiments are not limited thereto.

Referring to FIG. 16B, the program mode table PMT1' may store program modes corresponding respectively to a plurality of physical page numbers (PPNs). In some example embodiments, the program mode table PMT1' may store a program mode for each PPN group describing a start PPN and an end PPN. For example, a program mode for a first PPN PPN1 may be determined to be a QLC mode, and a program mode for a second PPN PPN2 may be determined to be an MLC mode, but the example embodiments are not limited thereto.

Referring to FIGS. 1, 16A, and 16B, the memory controller 100 may update a program mode table PMT1 and/or PMT2 after a program mode is determined based on an EPI, or after a program operation is performed on the NVM 200 in the determined program mode. In at least one example embodiment, the memory controller 100 may store the program mode table PMT1 and/or PMT2 in a meta region of the NVM 200. In at least one example embodiment, the memory controller 100 may store the program mode table PMT1 and/or PMT2 in a memory (e.g., SRAM) of the memory controller 100 and/or a memory (e.g., DRAM) of the memory system 10, etc.

Figure 17:
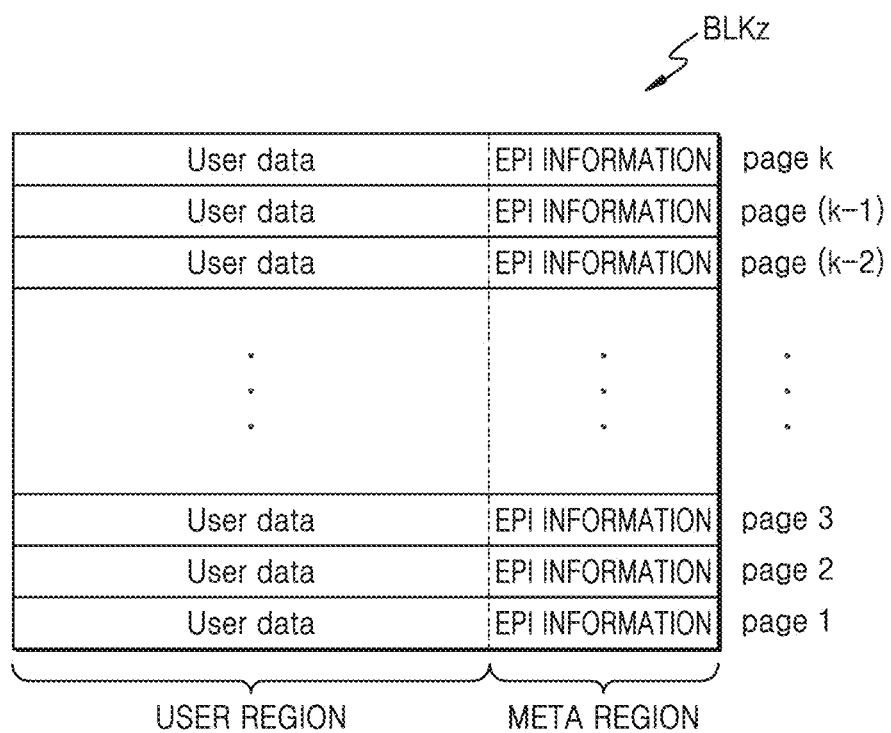
FIG. 17 shows a memory block configured to store EPI information according to at least one example embodiment.

FIG. 17 shows a memory block BLKz configured to store EPI information according to at least one example embodiment.

Referring to FIG. 17, EPI information and/or program mode information about first to third pages page1 to page3 of a block BLKz may be stored in a meta region related to the first to third pages page1 to page3 of the block BLKz, but the example embodiments are not limited thereto. Also, EPI information and/or program mode information about other pages page(k-1) to page(k) of the block BLKz may be stored in a meta region related to the pages page(k-1) to page(k) of the block BLKz, but the example embodiments are not limited thereto.

As a first example, when a data write request is received, a memory controller 100 may read EPI information stored in a meta region of the block BLKz and determine a program mode of the block BLKz based on the read EPI information, etc. As a second example, when a data read request is received, the memory controller 100 may read program mode information stored in the meta region of the block BLKz and adjust a read condition (e.g., one or more read voltage levels) for the block BLKz based on the read program mode information, etc.

Figure 18A:
FIGS. 18A and 18B show an EPI table and a program mode table, respectively, according to some example embodiments.
Figure 18B:

FIGS. 18A and 18B show an EPI table ET2 and a program mode table PMT2, respectively, according to some example embodiments.

Referring to FIG. 18A, the EPI table ET2 may store EPI information corresponding to each of a plurality of memory stacks. Hereinafter, a sub-memory stack will be referred to as a stack for brevity. For example, EPI information for a first stack STK1 may be stored as t1', and EPI information for a second stack STK2 may be stored as t2', etc.

Referring to FIG. 18B, the program mode table PMT2 may store program modes corresponding respectively to a plurality of stacks. In some example embodiments, the program mode table PMT2 may store a program mode for each stack group describing a start stack and an end stack. For instance, a program mode for a first stack STK1 may be determined to be a QLC mode, and a program mode for a second stack STK2 may be determined to be an MLC mode, but the example embodiments are not limited thereto. Hereinafter, a structure and definition of a stack will be described with reference to FIG. 19.

Figure 19:
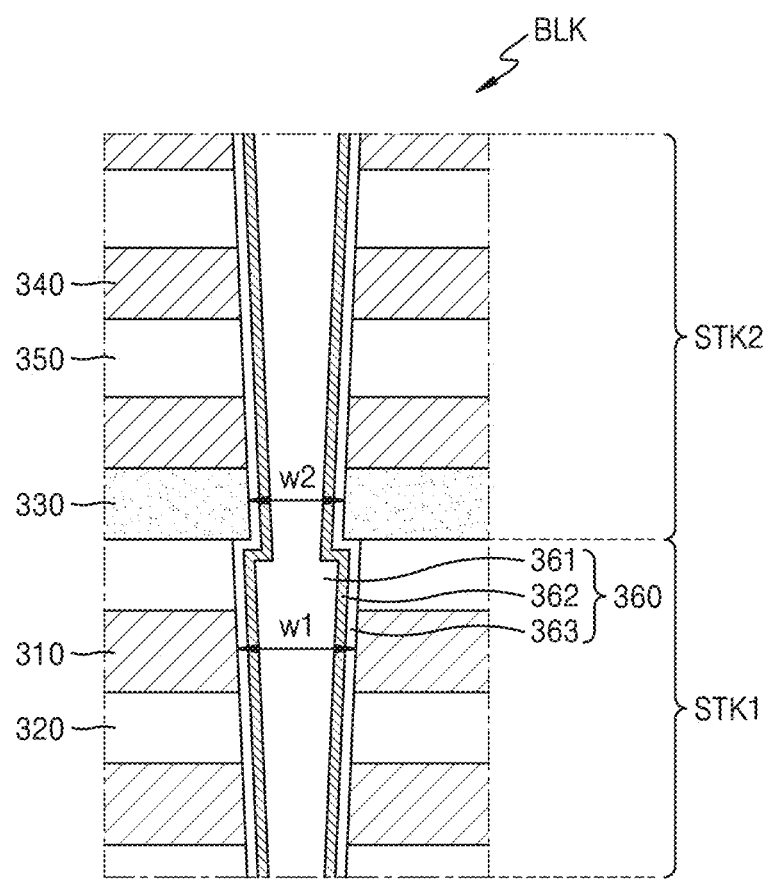
FIG. 19 is a partial cross-sectional view of a memory block according to at least one example embodiment.

FIG. 19 is a partial cross-sectional view of a memory block BLK according to at least one example embodiment.

Referring to FIG. 19, in a vertical memory device according to at least one example embodiment, an etching process for forming a channel hole may be performed to form a channel structure in a memory block BLK having a 3D structure, and a diameter of the channel hole may vary according to a height of the memory block BLK, however the example embodiments are not limited thereto. For example, the dimeter of the channel hole may be reduced from an upper portion of the memory block BLK having the 3D structure to a lower portion thereof. To reduce and/or prevent the diameter of the channel hole from being reduced more than desired and/or excessively reduced in the memory block BLK having the 3D structure, an etching process for forming the channel hole may be performed at least twice. Specifically, after a first stack STK1 (i.e., a first stack structure) is formed on a substrate, an etching process may be performed, and a second stack STK2 (i.e., a second stack structure) may be formed on the first stack SK1, etc. Also, an etching process may be performed on the second stack STK2, etc.

In at least one example embodiment, in the memory block BLK having the 3D structure, the first stack STK1 may include a gate electrode 310 and/or an insulating film 320, etc., which are alternately located in a perpendicular direction, but the example embodiments are not limited thereto. Also, the second stack STK2 stacked on the first stack STK1 may include a gate electrode 340 and/or an insulating film 350, etc., which are alternately located in a perpendicular direction, but the example embodiments are not limited thereto. According to at least one example embodiment, an inter-structure layer 330 may be located between the first stack STK1 and the second stack STK2. Also, a channel structure 360 may include a channel 362, a dielectric film structure 363 surrounding an outer sidewall of the channel 362, and/or a channel buried film pattern 361 located inside the channel 362, etc. The above-described structure may be merely at least one example embodiment, and a memory block BLK having a 3D structure according to one or more example embodiments may have various other structures in which an etching process is performed at least twice.

Figure 20:
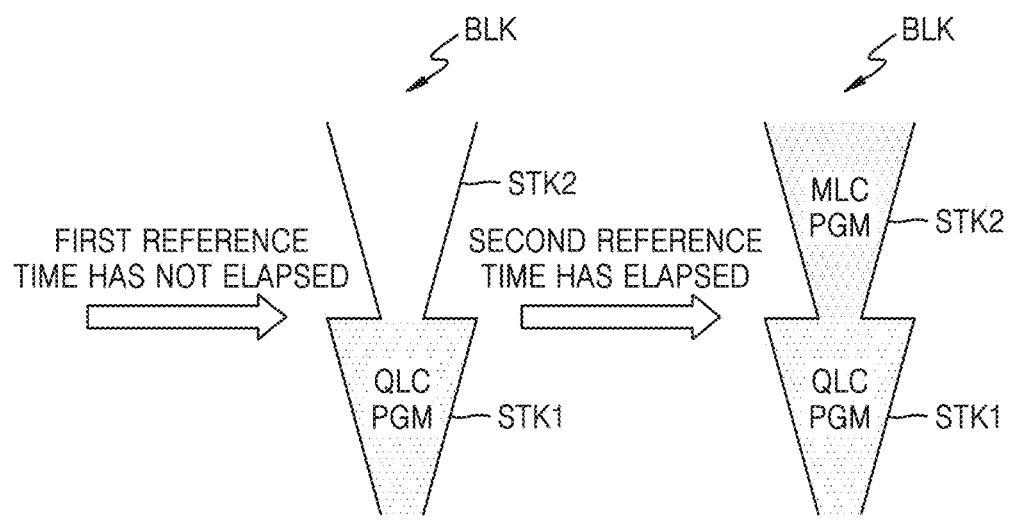
FIG. 20 is a conceptual diagram of a program operation for a stack, according to at least one example embodiment.

FIG. 20 is a conceptual diagram of a program operation for a stack, according to at least one example embodiment.

Referring to FIGS. 1 and 18A to 20, a memory group may correspond to a stack, and a memory system 10 may manage an EPI in units of stacks and determine a program mode. For example, a block BLK may include at least first and second stacks STK1 and STK2, which are stacked on a substrate in a perpendicular direction, but the example embodiments are not limited thereto. For example, the first and second stacks STK1 and STK2 may respectively have simplified structures of the first and second stacks STK1 and STK2 shown in FIG. 19. The operating methods shown in FIGS. 8 to 15 may be applied to the present example embodiment.

In at least one example embodiment, when a data write request for the block BLK is received, the memory system 10 may detect a first EPI t1' of the first stack STK1 based on an EPI table ET2. Thereafter, the memory system 10 may determine if the detected first EPI t1' is equal to, or shorter than, a first reference time (e.g., tREF1 of FIG. 12). If it is determined that the detected first EPI t1' is equal to, or shorter than, the first reference time tREF1, the memory system 10 may perform a program operation on the first stack STK1 in a first program mode in which N-bit data is written to a memory cell. For example, N may be 4, and the first program mode may be a QLC mode, but the example embodiments are not limited thereto.

In at least one example embodiment, the memory system 10 may detect a second EPI t2' of the second stack STK2 based on the EPI table ET2. Thereafter, the memory system 10 may compare the detected second EPI t2' with first to third reference times (e.g., tREF1, tREF2, and tREF3 of FIG. 12), but the example embodiments are not limited thereto. When the detected second EPI t2' exceeds the second reference time tREF2, the memory system 10 may perform a program operation on the second stack STK2 in a third program mode in which L-bit data is written to a memory cell. For example, L may be 2, and the third program mode may be an MLC mode, but the example embodiments are not limited thereto.

Figure 21:
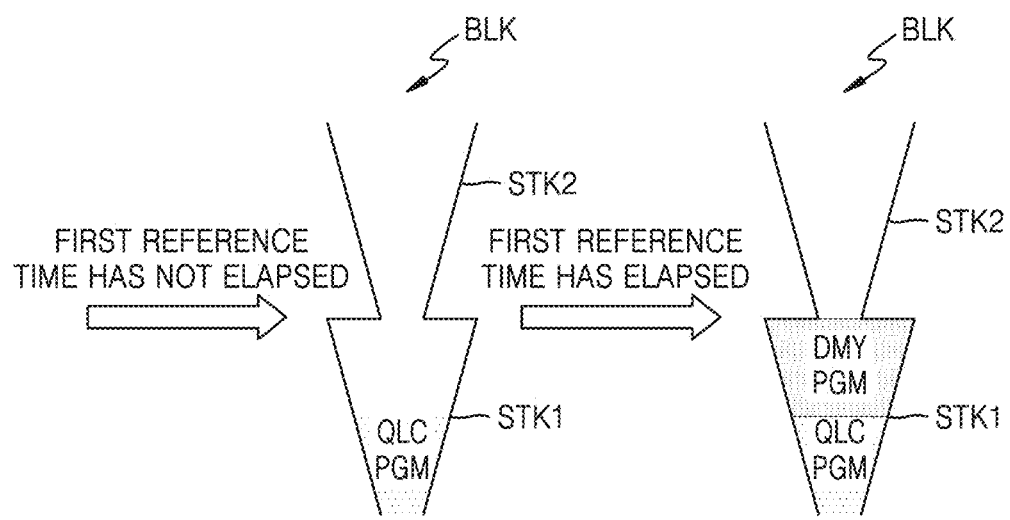
FIG. 21 is a conceptual diagram of a program operation for a stack, according to at least one example embodiment.

FIG. 21 is a conceptual diagram of a program operation for a stack, according to at least one example embodiment.

Referring to FIGS. 1 and 21, the program operation according to FIGS. 1 and 21 may correspond to a modified example embodiment of the program operation shown in FIG. 20. In at least one example embodiment, when a first EPI t1' for a first stack STK1 is equal to, or shorter than, a first reference time (e.g., tREF1 of FIG. 12), the memory system 10 may perform a program operation on some pages of the first stack STK1 in, for example, a QLC mode, but the example embodiments are not limited thereto. After the program operation on the some pages of the first stack STK1, when the first EPI t1' exceeds the first reference time tREF1, the memory system 10 may perform a dummy program operation of writing dummy data on the remaining pages of the first stack STK1, but the example embodiments are not limited thereto. As described above, only one program mode may be applied to one stack instead of a plurality of program modes.

Furthermore, according to some example embodiments, when an EPI corresponding to the first stack STK1 exceeds the first reference time tREF1 during the program operation on the first stack STK1, a program mode for a second stack STK2 may be determined to be at least one of a QLC mode, a TLC mode, an MLC mode, and an SLC mode, etc. In this case, a dummy program operation of writing dummy data may not be performed on the second stack STK2. Accordingly, a program operation may be efficiently performed for each sub-block, which is a smaller unit than a memory block.

FIGS. 22A and 22B show an EPI table ET3 and a program mode table PMT3, respectively, according to some example embodiments.

Referring to FIG. 22A, the EPI table ET3 may store EPI information corresponding to each of a plurality of sub-memory blocks. Hereinafter, a sub-memory block will be referred to as a sub-block for brevity. For example, EPI information about a first sub-block SBLK1 may be stored as t1", and EPI information about a second sub-block SBLK2 may be stored as t2".

Referring to FIG. 22B, the program mode table PMT3 may store program modes corresponding respectively to a plurality of sub-blocks. In some example embodiments, the program mode table PMT3 may store a program mode for each sub-block group describing a start sub-block and an end sub-block. For example, a program mode for the first sub-block SBLK1 may be determined to be a QLC mode, and a program mode for the second sub-block SBLK2 may be determined to be an MLC mode, but the example embodiments are not limited thereto. Hereinafter, at least one example embodiment in which EPI information is managed for each sub-block will mainly be described with reference to FIGS. 23 and 24.

Figure 23:
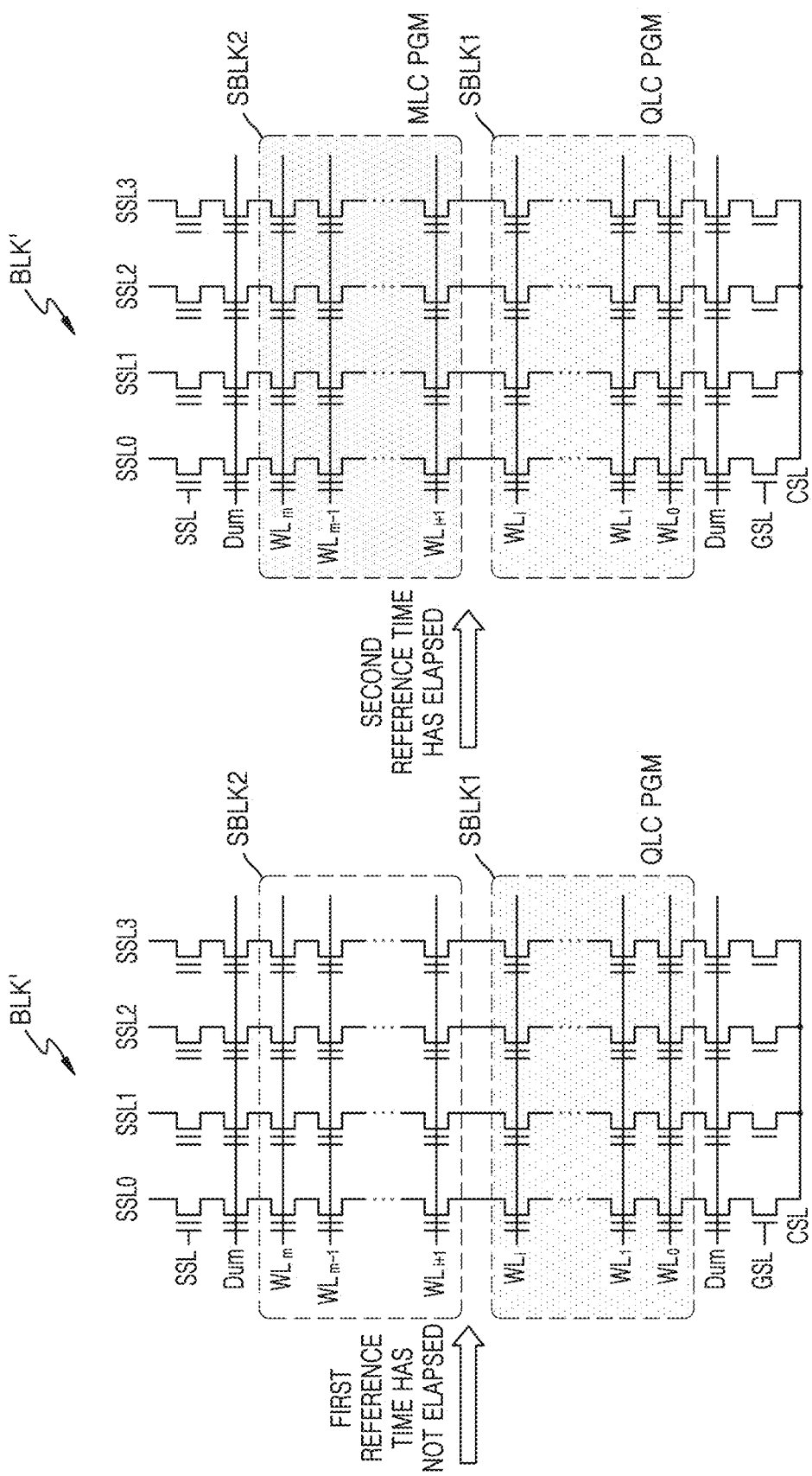
FIG. 23 is a conceptual diagram of a program operation for a sub-block, according to at least one example embodiment.

FIG. 23 is a conceptual diagram of a program operation for a sub-block, according to at least one example embodiment.

Referring to FIGS. 1 and 22A to 23, the memory group may correspond to a sub-block, and the memory system 10 may manage an EPI in units of sub-blocks and determine a program mode. Here, the sub-block may be an independently erasable unit and may be referred to as a partial block. For example, a block BLK' may include at least first and second sub-blocks SBLK1 and SBLK2, but is not limited thereto.

The first sub-block SBLK1 may include 0-th to i-th word lines $WL_0$ to $WL_i$, and the second sub-block SBLK2 may include i+1-th to m-th word lines $WL_{i+1}$ to $WL_m$. As a size of the block BLK' increases, the block BLK' may be divided into a plurality of sub-blocks including the first and second sub-blocks SBLK1 and SBLK2, etc., to facilitate the management of blocks. In this case, an erase operation may be performed for each sub-block, and the memory block BLK' may be a desired and/or maximum memory unit that may be erased at the same time.

In at least one example embodiment, when a data write request for the block BLK' is received, the memory system 10 may detect a first EPI t1" of the first sub-block SBLK1 based on an EPI table ET3. Thereafter, the memory system 10 may determine if the detected first EPI t1" is equal to, or shorter than, a first reference time (e.g., tREF1 of FIG. 12, etc.). If it is determined that the detected first EPI t1" is equal to, or shorter than, the first reference time tREF1, the memory system 10 may perform a program operation on the first sub-block SBLK1 in a first program mode in which N-bit data is written to a memory cell. For example, N may be 4, and the first program mode may be a QLC mode, but the example embodiments are not limited thereto.

In at least one example embodiment, the memory system 10 may detect a second EPI t2" of the second sub-block SBLK2 based on the EPI table ET3. Thereafter, the memory system 10 may compare the detected second EPI t2" with first to third reference times (e.g., tREF1, tREF2, and tREF3 of FIG. 12, etc.). When the detected second EPI t2" exceeds the second reference time tREF2, the memory system 10 may perform a program operation on the second sub-block SBLK2 in a third program mode in which L-bit data is written to a memory cell. For example, L may be 2, and the third program mode may be an MLC mode, but the example embodiments are not limited thereto.

Figure 24:
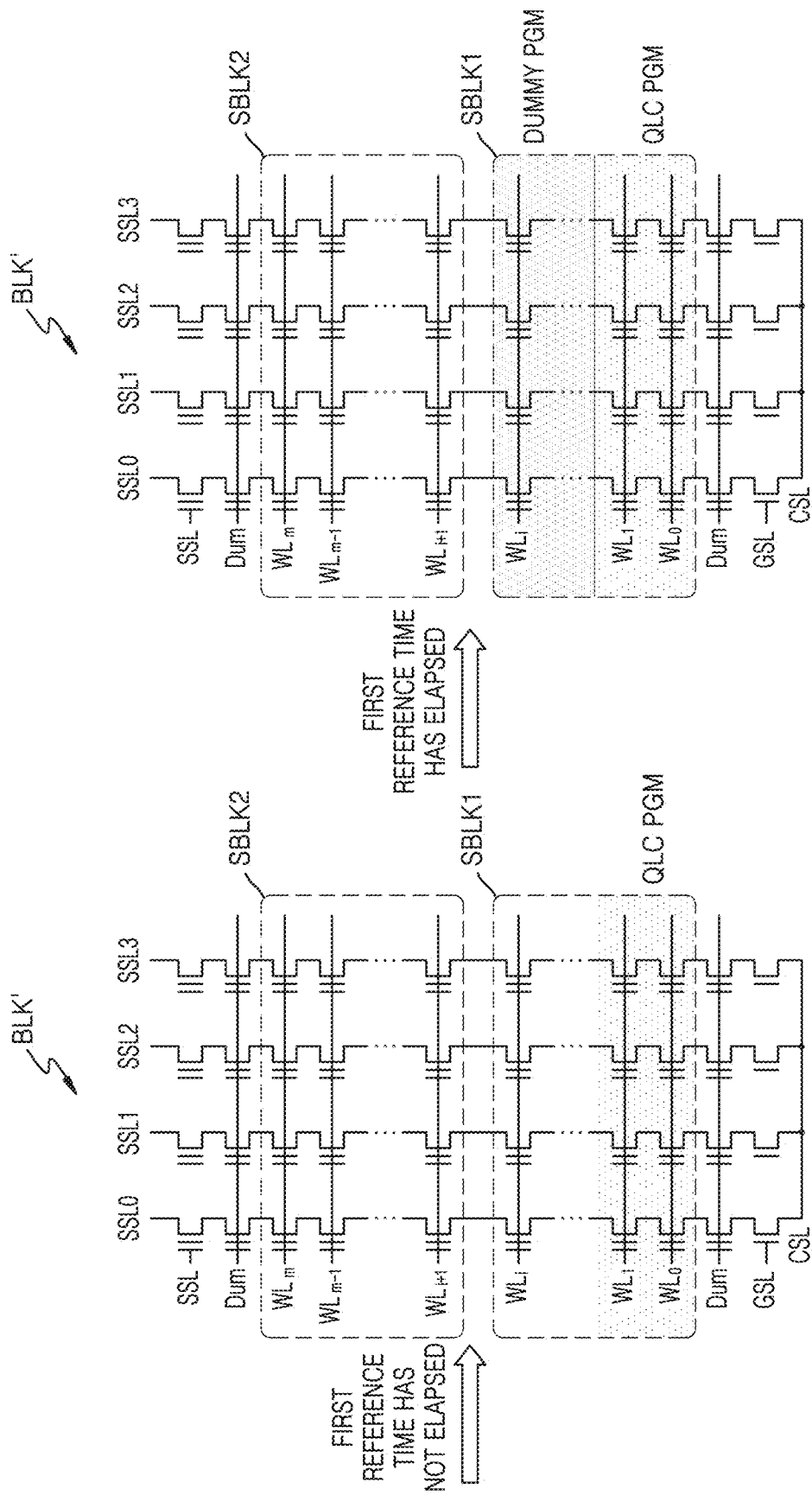
FIG. 24 is a conceptual diagram of a program operation for a sub-block, according to at least one example embodiment.

FIG. 24 is a conceptual diagram of a program operation for a sub-block, according to at least one example embodiment.

Referring to FIGS. 1 and 24, the program operation according to FIGS. 1 and 24 may correspond to a modified example of the program operation shown in FIG. 23. In at least one example embodiment, when a first EPI t1' of a first sub-block SBLK1 is equal to, or shorter than, a first reference time (e.g., tREF1 of FIG. 12), the memory system 10 may perform a program operation on some pages of the first sub-block SBLK1 in, for example, a QLC mode, but the example embodiments are not limited thereto. After the program operation on the some pages of the first sub-block SBLK1, when the first EPI t1' exceeds the first reference time tREF1, the memory system 10 may perform a dummy operation of writing dummy data to the remaining pages of the first sub-block SBLK1, but the example embodiments are not limited thereto. As described above, only one program mode may be applied to one sub-block instead of a plurality of program modes.

Furthermore, according to some example embodiments, when an EPI corresponding to the first sub-block SBLK1 exceeds the first reference time tREF1 during the program operation on the first sub-block SBLK1, a program mode for a second sub-block SBLK2 may be determined to be at least one of a QLC mode, a TLC mode, an MLC mode, and an SLC mode, etc. In this case, a dummy program operation of writing dummy data may not be performed on the second sub-block SBLK2. Accordingly, a program operation may be efficiently performed for each sub-block, which is a smaller unit than a memory block.

Figure 25:
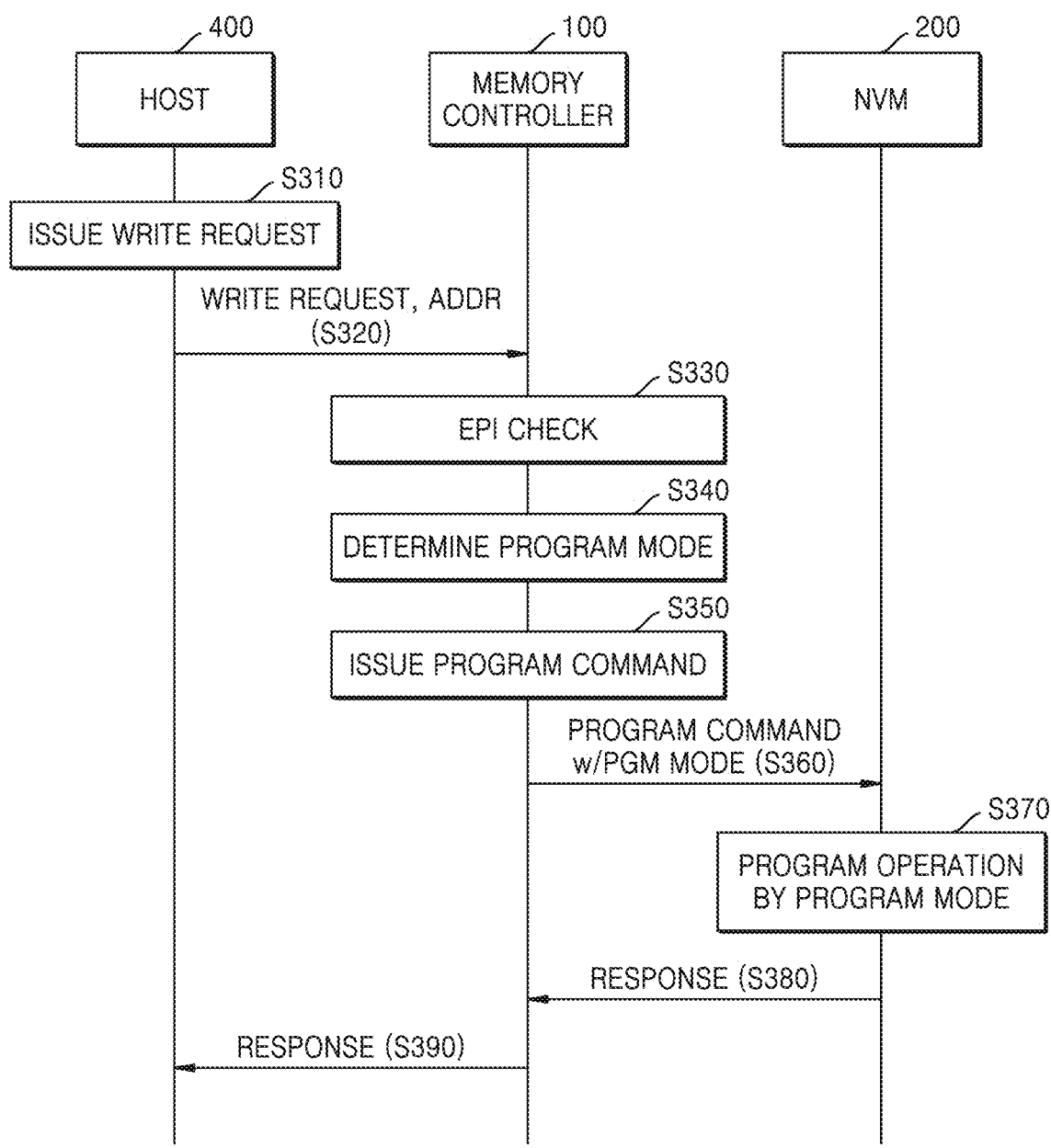
FIG. 25 is a flowchart of a data write operation among a host, a memory controller, and an NVM according to at least one example embodiment.

FIG. 25 is a flowchart of a data write operation among a host 400, a memory controller 100, and/or an NVM 200, etc., according to at least one example embodiment.

Referring to FIG. 25, in operation S310, a host 400 may issue a data write request. In operation S320, the host 400 may transmit the data write request and an address ADDR to a memory controller 100. In operation S330, the memory controller 100 may detect an EPI of a memory group corresponding to the received address ADDR. For example, the memory controller 100 may detect the EPI of the memory group based on EPI tables (refer to ET1 of FIG. 7, ET2 of FIG. 18A, and ET3 of FIG. 22A, but the example embodiments are not limited thereto).

In operation S340, the memory controller 100 may determine a program mode for the memory group based on the detected EPI. In operation S350, the memory controller 100 may issue a program command (e.g., a programming command, such as a write command, etc.) in the determined program mode. In operation S360, the memory controller 100 may transmit a program command along with the program mode to the NVM 200. In this case, the memory controller 100 may also transmit user data and/or meta data to be written, to the NVM 200. In operation S370, the NVM 200 may perform a program operation on the memory group in the program mode, such as performing a write command using adjusted write voltage levels based on the detected EPI. In operation S380, the NVM 200 may transmit a response message indicating that the program operation has been completed, to the memory controller 100. In operation S390, the memory controller 100 may transmit a response message indicating that the data write operation has been completed, to the host 400.

Figure 26:
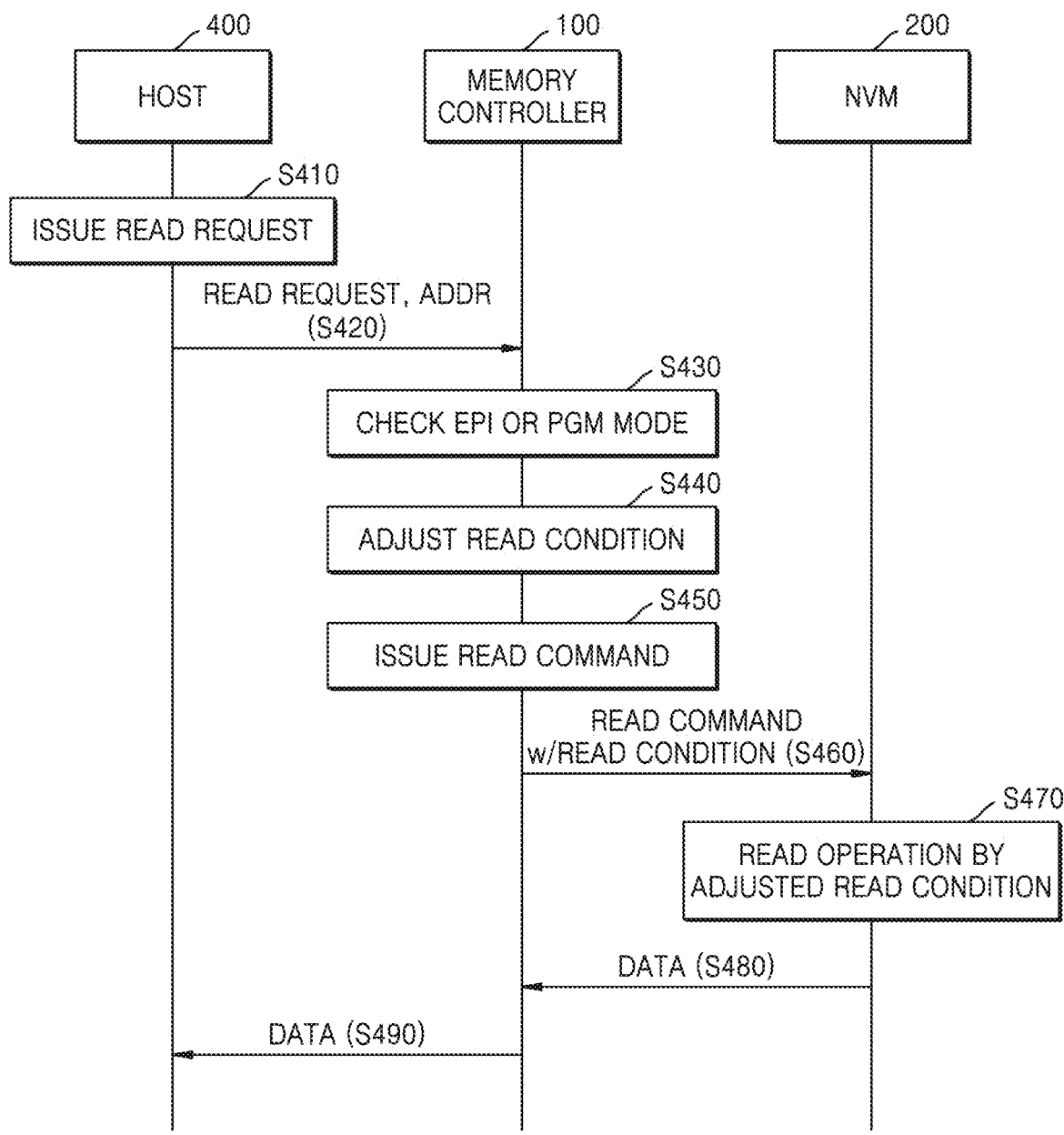
FIG. 26 is a flowchart of a data read operation among a host, a memory controller, and an NVM according to at least one example embodiment.

FIG. 26 is a flowchart of a data read operation between a host 400, a memory controller 100, and/or an NVM 200, etc., according to at least one example embodiment.

Referring to FIG. 26, in operation S410, the host 400 may issue a data read request. In operation S420, the host 400 may transmit the data read request and/or an address ADDR to the memory controller 100. In operation S430, the memory controller 100 may detect an EPI and/or program mode of a memory group corresponding to the received address ADDR. For example, the memory controller 100 may detect the EPI of the memory group based on EPI tables (refer to ET1 of FIG. 7, ET2 of FIG. 18A, and ET3 of FIG. 22A, but the example embodiments are not limited thereto). For example, the memory controller 100 may detect the EPI of the memory group based on the program mode tables (refer to PMT1 of FIG. 16A, PMT1' of FIG. 16B, PMT2 of FIG. 18B, and PMT3 of FIG. 22B, but the example embodiments are not limited thereto).

In operation S440, the memory controller 100 may adjust a read condition for the memory group based on the detected EPI and/or program mode. For example, the read condition may include a read voltage level and/or a read time. In operation S450, the memory controller 100 may issue a read command with an adjusted read condition, by adjusting the read voltage based on the detected EPI and/or program mode. In operation S460, the memory controller 100 may transmit the read command along with the read condition to the NVM 200. In operation S470, the NVM 200 may perform a read operation on the memory group on the adjusted read condition. In operation S480, the NVM 200 may transmit the read data to the memory controller 100. In operation S490, the memory controller 100 may transmit the read data to the host 400.

Figure 27:
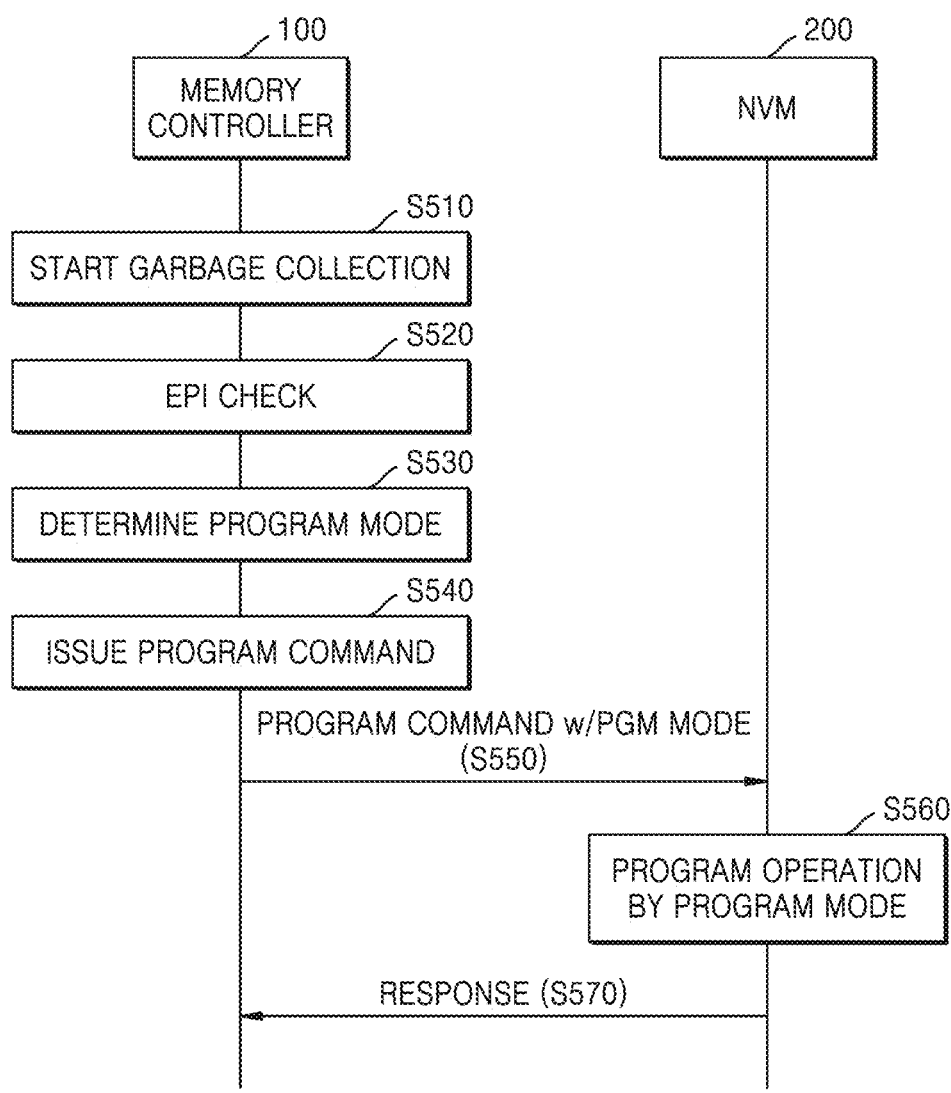
FIG. 27 is a flowchart of a garbage collection operation between a memory controller and an NVM according to at least one example embodiment.

FIG. 27 is a flowchart of a garbage collection operation between a memory controller 100 and/or an NVM 200, etc., according to at least one example embodiment.

Referring to FIG. 27, in operation S510, the memory controller 100 may start a garbage collection operation. The garbage collection operation may refer to an operation of making a source block a free block by programming valid data included in a source block to a target block. For example, the memory controller 100 may perform a garbage collection operation as a background operation. In operation S520, the memory controller 100 may detect an EPI of the target block. In operation S530, the memory controller 100 may determine a program mode for the target block based on the detected EPI. In operation S540, the memory controller 100 may issue a program command in the determined program mode.

In operation S550, the memory controller 100 may transmit the program command together with the program mode, or in other words, the program command may include program mode information indicating the program mode, to the NVM 200. In operation S560, the NVM 200 may perform a program operation on a target block based on the program mode information. In operation S570, the NVM 200 may transmit a response message indicating that the program operation on the target block has been completed, to the memory controller 100.

Figure 28:
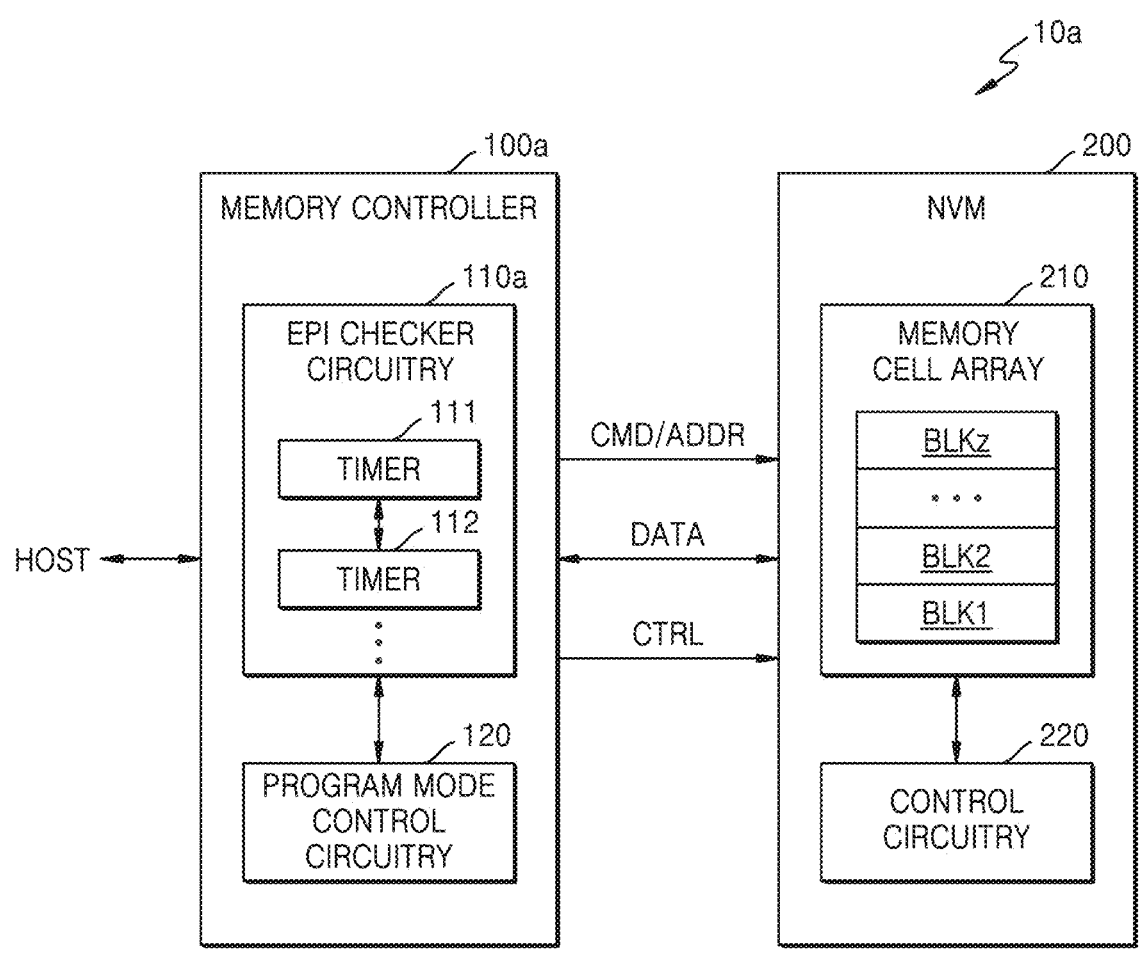
FIGS. 28 to 30 are block diagrams of modified examples of the memory system of FIG. 1, according to some example embodiments.

FIG. 28 is a block diagram of a modified example of the memory system of FIG. 1, according to at least one example embodiment.

Referring to FIG. 28, a memory system 10a may include a memory controller 100a and/or an NVM 200, etc., and the memory controller 100a may include an EPI checker circuitry 110a and/or program mode control circuitry 120, etc. Also, the NVM 200 may include a memory cell array 210 including a plurality of blocks BLK1 to BLKz and/or control circuitry 220, etc. The memory system 10a according to at least one example embodiment may correspond to a modified example of the memory system 10 of FIG. 1, and the above descriptions presented with reference to FIGS. 1 to 27 may be applied to the modified example embodiment.

The EPI checker circuitry 110a may include a plurality of timers (e.g., first and second timers 111 and 112, etc.), and the number of timers (e.g., the first and second timers 111 and 112, etc.) may correspond to the number of blocks BLK1 to BLKz. The memory controller 100a may determine a location of a block that is requested to write data from a host. The EPI checker circuitry 110a may refer to a value of a timer corresponding to the determined block and detect an EPI of the block. Each of the first and second timers 111 and 112 may determine a period between an erase time point and a write time point of a block corresponding thereto, and detect and/or measure an EPI of the block. In an example, the first timer 111 corresponding to a first block BLK1 may determine an elapse of time from an erase time point of the first block BLK1 to a program time point of the first BLK1, and detect and/or measure an EPI of the first block BLK1.

Figure 29:
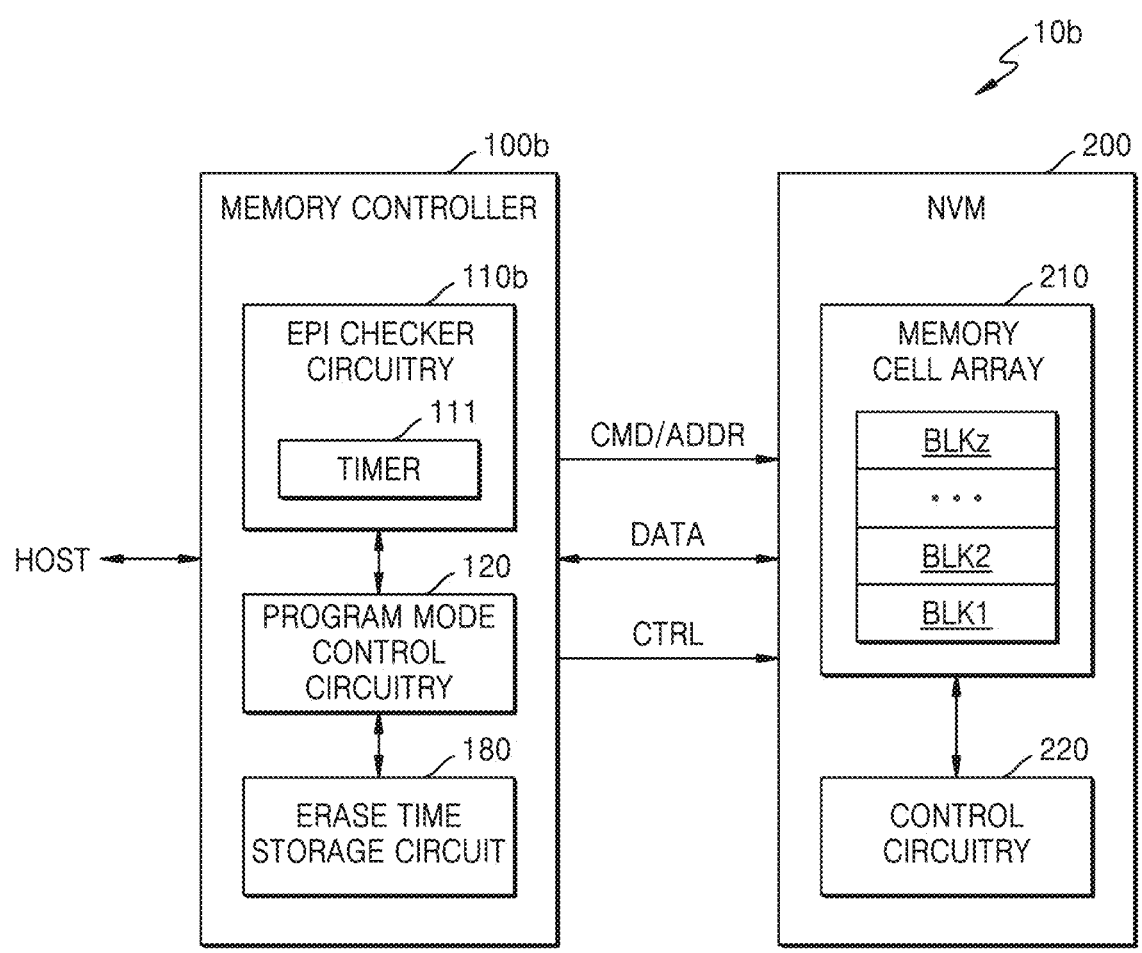

FIG. 29 is a block diagram of a modified example of the memory system of FIG. 1, according to at least one example embodiment.

Referring to FIG. 29, a memory system 10b may include a memory controller 100b and/or an NVM 200, etc. The memory controller 100b may include an EPI checker circuitry 110b, a program mode control circuitry 120, and/or an erase time storage circuit 180, etc. The memory system 10b according to at least one example embodiment may correspond to a modified example of the memory system 10 of FIG. 1, and the above descriptions presented with reference to FIGS. 1 to 27 may be applied to the example embodiment, but the example embodiments are not limited thereto.

The EPI checker circuitry 110b may include a timer 111, which may be shared between at least two blocks. For example, the timer 111 included in the EPI checker circuitry 110b may detect EPIs of a first block BLK1 and a second block BLK2, etc. The timer 111 may determine a time point at which an erase operation is performed on the first block BLK1, and a time point at which an erase operation is performed on the second block BLK2. In an example, an erase time point of the first block BLK1 may be different from an erase time point of the second block BLK2, and determined erase time points may be stored in the erase time storage circuit 180 and/or a meta region of the memory cell array 210, etc.

Subsequently, the timer 111 may continuously determine an elapse of time, and determine a write time point of the first block BLK1 when a write request for the first block BLK1 is received. The EPI checker circuitry 110b may confirm information indicating the previously stored erase time point of the first block BLK1, detect and/or measure an EPI indicating a period from a write time point to an erase time point, and perform a program operation on the first block BLK1 in any one of a plurality of program modes according to one or more of the above-described example embodiments, based on the detected EPI. Similarly, the timer 111 may determine a write time point of the second block BLK2, and detect and/or measure an EPI of the second block BLK2 based on information indicating the previously stored erase time point of the second block BLK2 and the write time point of the second block BLK2.

Figure 30:
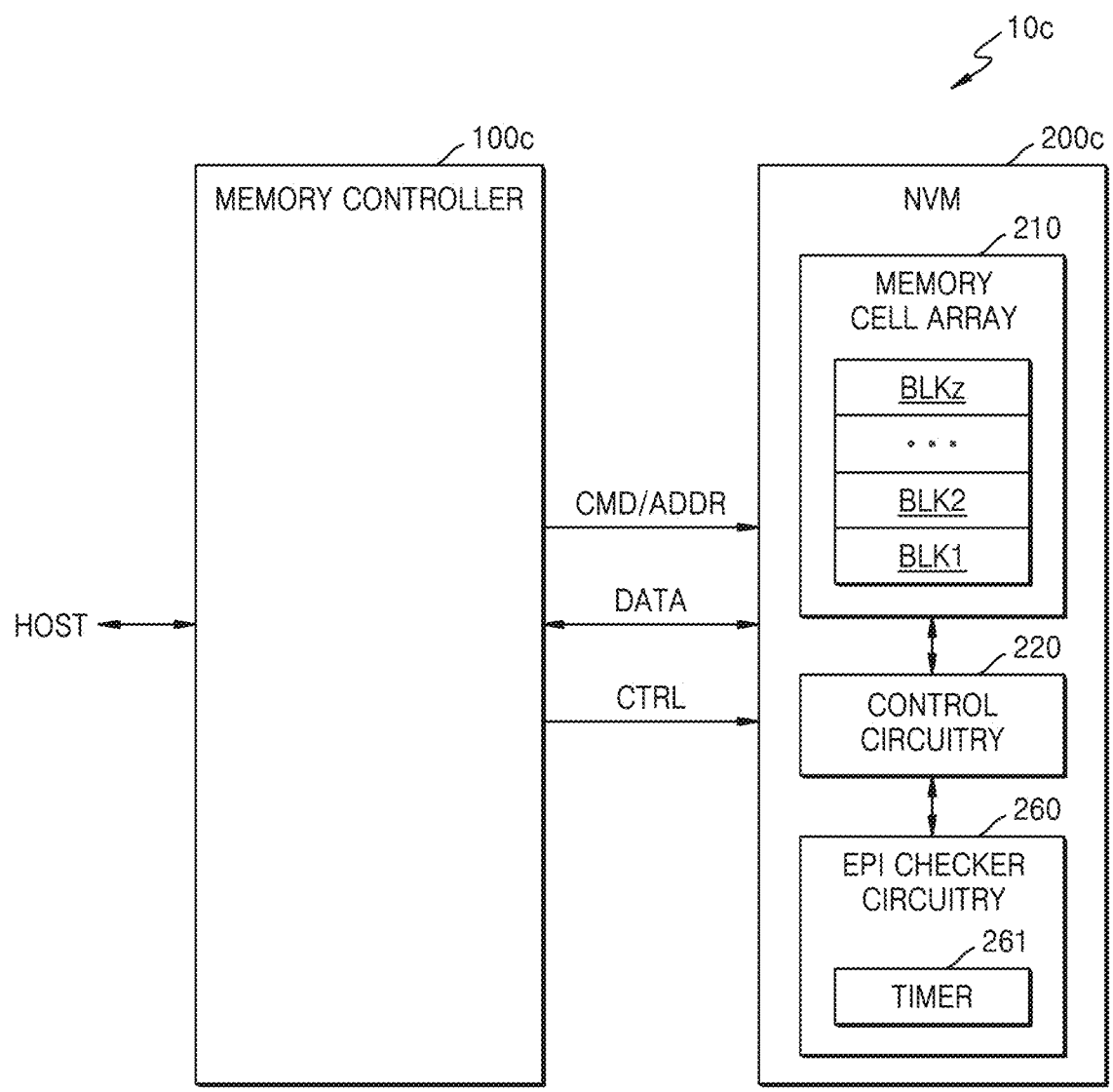

FIG. 30 is a block diagram of a modified example of the memory system of FIG. 1, according to at least one example embodiment.

Referring to FIG. 30, a memory system 10c may include a memory controller 100c and/or a NVM 200c, etc. The NVM 200c may include a memory cell array 210, a control circuitry 220, and/or an EPI checker circuitry 260, etc. The NVM 200c may determine a block in which data is to be written, based on an address ADDR that is provided along and/or included with a program command from the memory controller 100c. In an example, the address ADDR may include a block address indicating any one of a plurality of blocks BLK1 to BLKz of the memory cell array 210.

The EPI checker circuitry 260 may detect an EPI of a block that is selected by the block address. As in the above-described example embodiment, the EPI checker circuitry 260 may include at least one timer 261. As an example, the EPI checker circuitry 260 may include timers in equal number to the number of the blocks BLK1 to BLKz included in the memory cell array 210, or in a smaller number than the number of the blocks BLK1 to BLKz, etc.

For instance, a first block BLK1 may perform an erase operation in response to an erase command received from the memory controller 100c, or perform an erase operation due to an internal operation (e.g., a garbage collection operation) of the NVM 200c. The EPI checker circuitry 260 may determine an erase time point of the first block BLK1 and detect and/or measure an EPI of the first block BLK1 by determining an elapsed time until a program operation is performed after the erase operation is performed.

The control circuitry 220 may receive EPI information from the EPI checker circuitry 260, determine a program mode based on the received EPI information, and control a program operation on the memory cell array 210 according to the determined program mode. In addition, the control circuitry 220 may receive EPI information from the EPI checker circuitry 260, determine a read condition (e.g., a read voltage level and the like) based on the received EPI information, and control a read operation on the memory cell array 210 under the determined read condition.

Figure 31:
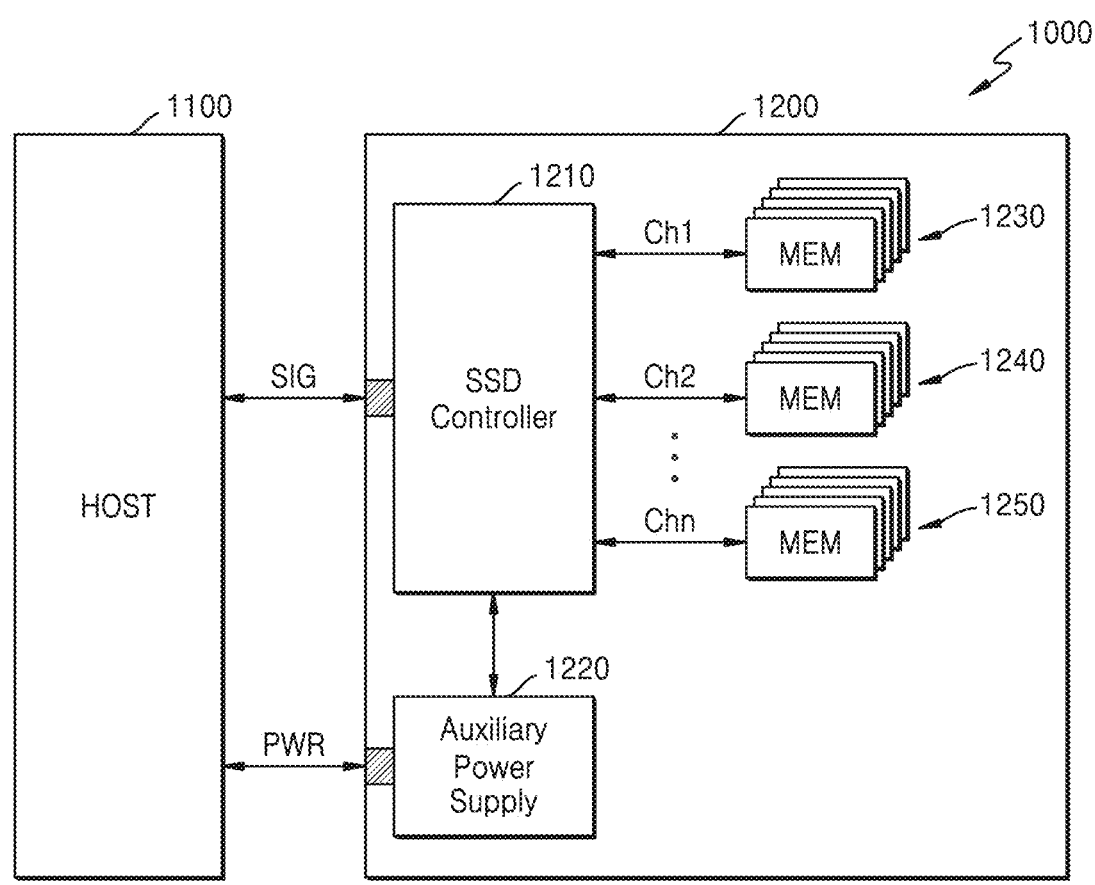
FIG. 31 is a block diagram of an example of applying a memory system according to at least one example embodiment to a solid-state drive (SSD) system.

FIG. 31 is a block diagram of an example of applying a memory system according to at least one example embodiment to a SSD system 1000.

Referring to FIG. 31, the SSD system 1000 may include a host 1100 and/or an SSD 1200, etc. The SSD 1200 may transmit and receive a signal SIG to and from the host 1100 through a signal connector and receive power PWR through a power connector. The SSD 1200 may include an SSD controller 1210, an auxiliary power device 1220, and/or a plurality of memory devices 1230, 1240, and 1250, etc., but the example embodiments are not limited thereto. The plurality of memory devices 1230, 1240, and 1250 may be connected to the SSD controller 1210 through a plurality of channels Ch1, Ch2, and Chn, respectively.

The SSD controller 1210 may be implemented using the plurality of memory controllers 100, 100a, 100b, and 100c, etc., that are described above with reference to FIGS. 1 to 30, but is not limited thereto. For example, the SSD controller 1210 may determine a program mode corresponding to a memory group based on an EPI of the memory group. Also, the SSD controller 1210 may adjust a read condition corresponding to the memory group based on EPI information and/or a program mode corresponding to the memory group, including adjusting at least one voltage level (e.g., read voltage threshold levels, etc.) based on the EPI information and/or program mode.

The memory devices 1230, 1240, and 1250 may be implemented using the plurality of NVMs 200, 200a, 200b, and 200c described above with reference to FIGS. 1 to 30, but are not limited thereto. For example, each of the memory devices 1230, 1240, and 1250 may perform a program operation on a memory group in the determined program mode and/or perform a read operation on the memory group in the adjusted read condition, including adjusting at least one voltage level associated with the program operation and/or the read operation based on the EPI information and/or program mode.

Figure 32:
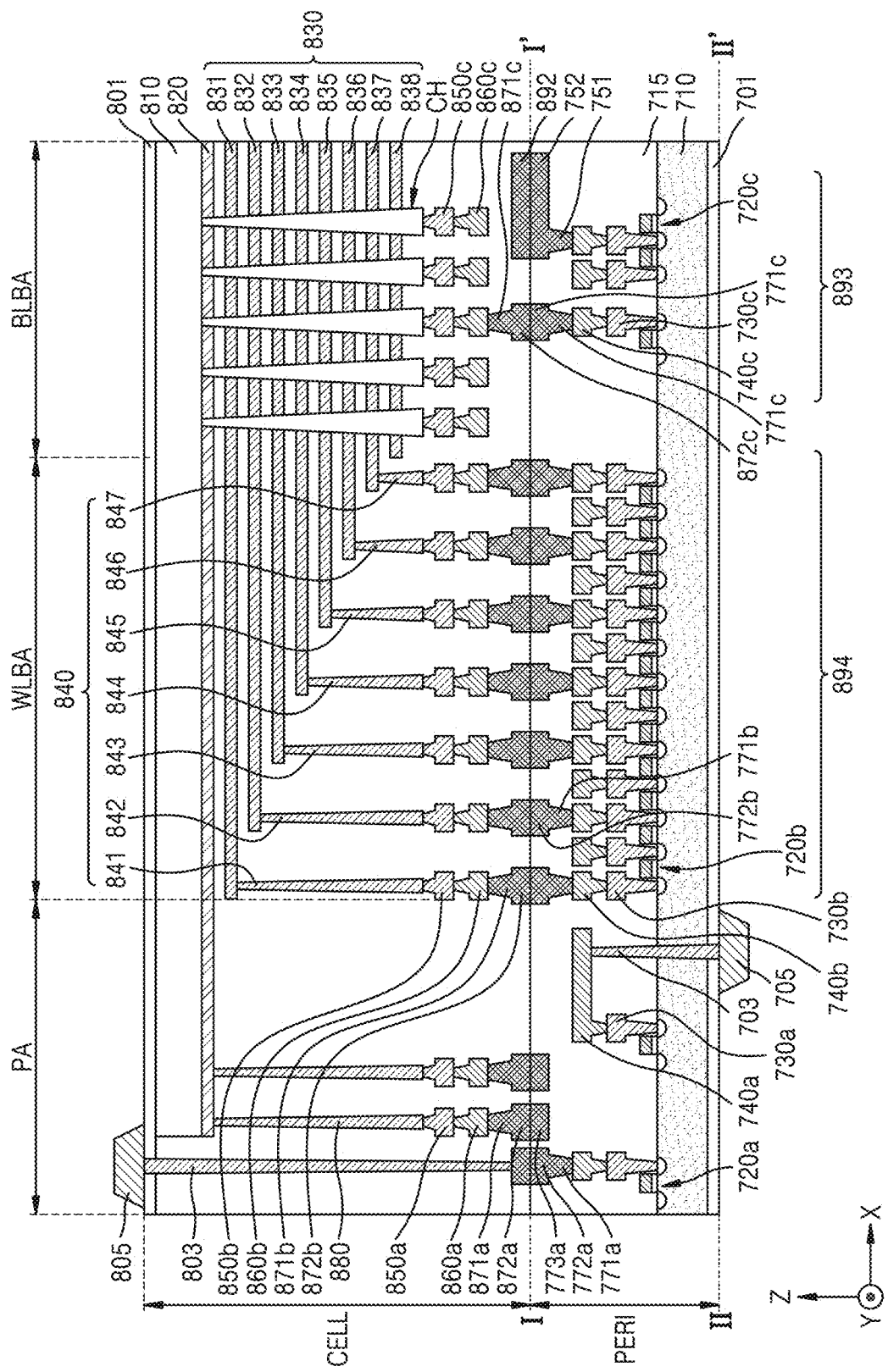
FIG. 32 illustrates a memory device having a chip-to-chip structure, according to some example embodiments.

FIG. 32 illustrates a memory device 900 having a chip-to-chip structure, according to some example embodiments.

Referring to FIG. 32, a memory device 900 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten. Each memory device of the above embodiments may be implemented as the memory device 900.

Each of the peripheral circuit region PERI and the cell region CELL of the memory device 900 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In at least one example embodiment, the first metal layers 730a, 730b, and 730c may be formed of tungsten having relatively high resistance, and the second metal layers 740a, 740b, and 740c may be formed of copper having relatively low resistance.

In at least one example embodiment illustrate in FIG. 32, although the first metal layers 730a, 730b, and 730c and the second metal layers 740a, 740b, and 740c are shown and described, they are not limited thereto, and one or more metal layers may be further formed on the second metal layers 740a, 740b, and 740c. At least a portion of the one or more metal layers formed on the second metal layers 740a, 740b, and 740c may be formed of aluminum or the like having a lower resistance than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically connected to c in a bonding manner, and the lower bonding metals 771b and 772b and the upper bonding metals 871b and 872b may be formed of aluminum, copper, tungsten, or the like. Further, the upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In at least one example embodiment, the bit line 860c may extend in a first direction (a Y-axis direction), parallel to the upper surface of the second substrate 810.

In at least one example embodiment illustrated in FIG. 32, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. For example, the bit line 860c may be connected to upper bonding metals 871c and 872c in the cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in a second direction (an X-axis direction), parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In at least one example embodiment, operating voltages of the circuit elements 720b providing the row decoder 894 may be different than operating voltages of the circuit elements 720c providing the page buffer 893. For example, operating voltages of the circuit elements 720c providing the page buffer 893 may be greater than operating voltages of the circuit elements 720b providing the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 32, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 32, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit region PERI through a second input-output contact plug 803.

According to embodiments, the second substrate 810 and the common source line 820 may not be disposed in an area in which the second input-output contact plug 803 is disposed. Also, the second input-output pad 805 may not overlap the word lines 830 in the third direction (the Z-axis direction). Referring to FIG. 32, the second input-output contact plug 803 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 900 may include a lower metal pattern 773a, corresponding to an upper metal pattern 872a formed in an uppermost metal layer of the cell region CELL, and having the same shape as the upper metal pattern 872a of the cell region CELL, in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu—Cu bonding.

Further, the bit line bonding area BLBA, an upper metal pattern 892, corresponding to a lower metal pattern 752 formed in the uppermost metal layer of the peripheral circuit region PERI, and having the same shape as the lower metal pattern 752 of the peripheral circuit region PERI, may be formed in an uppermost metal layer of the cell region CELL. A contact may not be formed on the upper metal pattern 892 formed in the uppermost metal layer of the cell region CELL.

In at least one example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While various example embodiments of the inventive concepts has been particularly shown and described with reference to example embodiments thereof, it will be understood that various changes in form and details may be made therein without departing from the spirit and scope of the following claims.

What is claimed is:

1. A method of operating a memory system, the memory system including a non-volatile memory, the non-volatile memory including a memory cell region including a memory group and a first metal pad, and a peripheral circuit region including a second metal pad and vertically connected to the memory cell region by the first metal pad and the second metal pad, the method comprising:
   measuring, using processing circuitry, an erase program interval (EPI) of the memory group, the EPI being a time period from an erase time point to a program time point of the memory group;
   determining, using the processing circuitry, a plurality of program modes based on a number of data bits stored in each memory cell of the memory group;
   selecting, using the processing circuitry, a program mode for the memory group from the plurality of program modes, based on the measured EPI of the memory group; and
   performing, using the processing circuitry, a program operation on the memory group corresponding to the selected program mode, the performing the program operation on the memory group including adjusting at least one voltage level of the program operation based on the selected program mode.

2. The method of claim 1, wherein
the plurality of program modes comprise at least one of a quadruple-level cell (QLC) mode, a triple level cell (TLC) mode, a multi-level cell (MLC) mode, and a single level cell (SLC) mode, or combinations thereof.

3. The method of claim 1, wherein
the memory group comprises at least one of a memory block, a memory stack, and a sub-memory block, or combinations thereof.

4. The method of claim 1, wherein
the memory group includes a memory block; and
the selecting the program mode comprises,
   selecting the program mode for the memory block as a first program mode in which N-bit data is written to each memory cell, in response to the measured EPI being equal to, or shorter than, a reference time, and
   selecting the program mode for the memory block as a second program mode in which M-bit data is written to each memory cell, in response to the measured EPI exceeding the reference time,
wherein N and M are positive integers, and M is less than N.

5. The method of claim 1, wherein
the memory cell region comprises a plurality of memory blocks, each memory block of the plurality of memory blocks comprising a plurality of memory stacks stacked on a substrate in a perpendicular direction to a substrate of the non-volatile memory;
the memory group includes a memory stack;
the measuring of the EPI of the memory group comprises,
   measuring a first EPI of a first memory stack of the memory group, and
   measuring a second EPI of a second memory stack of the memory group, the second memory stack located on the first memory stack in a perpendicular direction to the first memory stack; and
the selecting of the program mode comprises,
   selecting a program mode for the first memory stack as at least one of quadruple level cell (QLC) mode, a triple level cell (TLC) mode, a multi-level cell (MLC) mode, and a single level cell (SLC) mode, based on the first EPI, and
   selecting a program mode for the second memory stack as at least one of the QLC mode, the TLC mode, the MLC mode, and the SLC mode, based on the second EPI.

6. The method of claim 1, wherein
the memory cell region comprises a plurality of memory blocks, each of the memory blocks of the plurality of memory blocks including a plurality of sub-memory blocks that are independently erasable;
the measuring of the EPI of the memory group comprises,
   measuring a first EPI of a first sub-memory block, and
   measuring a second EPI of a second sub-memory block located adjacent to the first sub-memory block; and
the selecting the program mode comprises,
   selecting a program mode for the first sub-memory block as at least one of a quadruple level cell (QLC) mode, a triple level cell (TLC) mode, a multi-level cell (MLC) mode, and a single level cell (SLC) mode, based on the first EPI; and
   selecting a program mode for the second sub-memory block as at least one of the QLC mode, the TLC mode, the MLC mode, and the SLC mode, based on the second EPI.

7. The method of claim 6, wherein
the selecting the program mode for the second sub-memory block further includes selecting at least one of the QLC mode, the TLC mode, the MLC mode, and the SLC mode as the program mode for the second sub-memory block in response to the first EPI exceeding a reference time during a program operation performed on the first sub-memory block.

8. The method of claim 1, wherein
the memory cell region comprises a meta region configured to store an EPI table in which EPI information indicating the measured EPI corresponding to each memory group is stored; and
the measuring of the EPI of the memory group comprises measuring the EPI corresponding to the memory group based on the EPI table stored in the meta region.

9. The method of claim 1, further comprising:
selecting, using the processing circuitry, a program mode for the memory group, the selecting the program mode for the memory group including selecting a default program mode after occurrence of a sudden power-off (SPO) event, the default program mode being a multi-level cell (MLC) mode or a single level cell (SLC) mode.

10. The method of claim 1, wherein the measuring of the EPI of the memory group comprises at least one of:
measuring the EPI of the memory group during a user data program operation in response to a write request received from a host;
measuring the EPI of the memory group during a meta data program operation;
measuring the EPI of the memory group during a garbage collection operation; or
combinations thereof.

11. The method of claim 1, further comprising:
selecting a program mode corresponding to a memory block of the memory group, based on a program mode table in response to a read request for the memory group, the program mode table including a program mode corresponding to each memory group; and
adjusting a read condition for the memory group based on the selected program mode for the memory block of the memory group, the adjusting the read condition including adjusting at least one voltage level associated with the read condition based on the selected program mode of the memory block.

12. A method of operating a memory system, the memory system including a non-volatile memory, the non-volatile memory including a memory cell region including a memory block and a first metal pad, and a peripheral circuit region including a second metal pad and vertically connected to the memory cell region by the first metal pad and the second metal pad, the method comprising:
measuring, using processing circuitry, an erase program interval (EPI) of the memory block in response to a write request received from a host, the EPI being a time period from an erase time point to a program time point of the memory block; and
performing, using the processing circuitry, a program operation on the memory block in a first program mode or a second program mode based on a duration of the EPI, the first program mode including writing N-bit data to each memory cell of the memory block, and the second program mode including writing M-bit data to each memory cell of the memory block, the performing the program operation on the memory block including adjusting at least one voltage level of the program operation based on the first program mode or the second program mode,
wherein N and M are positive integers, and M is less than N.

13. A memory system comprising:
a non-volatile memory comprising:
a memory cell region including a plurality of memory groups and a first metal pad, and
a peripheral circuit region including a second metal pad and vertically connected to the memory cell region by the first metal pad and the second metal pad; and
a memory controller configured to,
measure an erase program interval (EPI) of a first memory group from among the plurality of memory groups, the EPI being a time period from an erase time point to a program time point of the memory group,
determine a plurality of program modes based on a number of data bits stored in each memory cell of the memory group,
select a program mode for the first memory group from the plurality of program modes based on the measured EPI, and
control a program operation on the first memory group based on the selected program mode of the first memory group, the controlling the program operation including adjusting at least one voltage level associated with the program operation based on the selected program mode.

14. The memory system of claim 13, wherein
the plurality of program modes comprise at least one of a quadruple level cell (QLC) mode, a triple level cell (TLC) mode, a multi-level cell (MLC) mode, and a single level cell (SLC) mode.

15. The memory system of claim 13, wherein
the memory group comprises a memory block, a memory stack, a sub-memory block, or combinations thereof.

16. The memory system of claim 13, wherein
the memory controller comprises program mode control circuitry configured to determine the program mode; and
the program mode control circuitry is configured to select the program mode for the first memory group to be a first program mode or a second program mode based on the measured EPI of the first memory group, the first program mode including writing N-bit data to each memory cell of the first memory group, and the second program mode including writing M-bit data is written to each memory cell of the first memory group, and
wherein N and M are positive integers, and M is less than N.

17. The memory system of claim 13, wherein the memory controller is further configured to:
update the program mode corresponding to the first memory group based on a program mode table, the program mode table including program modes corresponding respectively to the plurality of memory groups;
select a program mode corresponding to a read request received from a host based on the program mode table, in response to the read request received from the host; and
adjust a read condition for the first memory group based on the selected program mode of the memory group, the adjusting the read condition including adjusting at least one voltage level associated with the read condition based on the selected program mode of the memory group.

18. The memory system of claim 13, wherein the first metal pad and the second metal pad are formed of copper.

19. The memory system of claim 13, wherein the first metal pad and the second metal pad are connected by bonding manner.

20. The memory system of claim 13, wherein the memory cell region is formed on a first wafer and the peripheral circuit region is formed on a second wafer.

* * * * *